United States Patent
Okamura et al.

(10) Patent No.: US 8,189,304 B2
(45) Date of Patent: May 29, 2012

(54) MAGNETORESISTIVE MAGNETIC HEAD HAVING A CPP ELEMENT USING A HEUSLER ALLOY LAYER AND A HIGH SATURATION MAGNETIZATION LAYER

(75) Inventors: Susumu Okamura, Kanagawa (JP); Yo Sato, Kanagawa (JP); Katsumi Hoshino, Kanagawa (JP); Hiroyuki Hoshiya, Kanagawa (JP); Kenichi Meguro, Kanagawa (JP); Keizo Kato, Tokyo (JP)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 243 days.

(21) Appl. No.: 12/636,649

(22) Filed: Dec. 11, 2009

(65) Prior Publication Data

US 2010/0188771 A1 Jul. 29, 2010

(30) Foreign Application Priority Data

Dec. 15, 2008 (JP) ................................ 2008-318875

(51) Int. Cl.
*G11B 5/39* (2006.01)
(52) U.S. Cl. ............ 360/324.11; 360/324.12; 360/324.2
(58) Field of Classification Search ............... 360/324.1, 360/324.11, 324.12, 324.2
See application file for complete search history.

(56) References Cited

U.S. PATENT DOCUMENTS

| | | | |
|---|---|---|---|
| 2002/0048128 A1 | 4/2002 | Kamiguchi et al. | 360/324.1 |
| 2003/0137785 A1 | 7/2003 | Saito | 360/324.11 |
| 2007/0048485 A1 | 3/2007 | Jogo et al. | 428/64.1 |
| 2007/0230070 A1* | 10/2007 | Mizuno et al. | 360/324.12 |
| 2007/0268632 A1* | 11/2007 | Jogo et al. | 360/324.12 |
| 2007/0297104 A1* | 12/2007 | Mizuno et al. | 360/324.12 |
| 2008/0144235 A1* | 6/2008 | Gill | 360/324.12 |
| 2009/0080122 A1* | 3/2009 | Freitag et al. | 360/324.1 |
| 2009/0168266 A1* | 7/2009 | Sato et al. | 360/324.1 |
| 2010/0157465 A1* | 6/2010 | Sakamoto et al. | 360/75 |
| 2011/0089940 A1* | 4/2011 | Carey et al. | 324/252 |
| 2011/0149428 A1* | 6/2011 | Franca-Neto et al. | 360/75 |

FOREIGN PATENT DOCUMENTS

| | | |
|---|---|---|
| JP | 2002/015001 | 1/2002 |
| JP | 2002/208744 | 7/2002 |
| JP | 2007/088415 | 4/2007 |

* cited by examiner

*Primary Examiner* — Jefferson Evans
(74) *Attorney, Agent, or Firm* — Zilka-Kotab, PC

(57) ABSTRACT

A magnetoresistive magnetic head according to one embodiment uses a current-perpendicular-to-plane magnetoresistive element having a laminate of a free layer, an intermediate layer, and a pinned layer, the pinned layer being substantially fixed to a magnetic field to be detected, wherein either the pinned layer or the free layer includes a Heusler alloy layer represented by a composition of X—Y—Z, wherein X is between about 45 at. % and about 55 at. % and is Co or Fe, Y accounts for between about 20 at. % and about 30 at. % and is one or more elements selected from V, Cr, Mn, and Fe, and Z is between about 20 at. % and about 35 at. % and is one or more elements selected from Al, Si, Ga, Ge, Sn, and Sb, the other layer including a high saturation magnetization material layer having higher saturation magnetization than that of the Heusler alloy, and where the direction of the current flowing perpendicular to plane being a direction in which an electron flows from the Heusler alloy layer into the high saturation magnetization material layer. Additional embodiments are also presented.

17 Claims, 10 Drawing Sheets

MAGNETORESISTIVE MAGNETIC HEAD HAVING A CPP ELEMENT USING A HEUSLER ALLOY LAYER AND A HIGH SATURATION MAGNETIZATION LAYER

RELATED APPLICATIONS

The present application claims priority to a Japanese Patent Application filed Dec. 15, 2008, under Appl. No. 2008-318875, which is incorporated herein by reference.

FIELD OF THE INVENTION

The present invention relates to a magnetoresistive element and a magnetic head having the same. In particular, embodiments of the invention are suitable for application to a magnetic head for a high-density magnetic recording/read apparatus.

BACKGROUND OF THE INVENTION

Recording density of a magnetic recording apparatus having a hard disk drive has been increasing year by year, and there is a demand for increased sensitivity and density of a magnetoresistive magnetic head that is used as a read sensor. In order to satisfy such a demand, a CIP-GMR (Current in Plane-Giant Magnetoresistance) sensor having a thin nonmagnetic layer sandwiched between two kinds of ferromagnetic layers, in which a current is applied in the plane, has been developed and applied as a read head. Further, in order to achieve even higher density, a read head using TMR (Tunnel Magnetoresistance) effect, in which a voltage is applied perpendicularly to a thin insulating layer sandwiched between two ferromagnetic layers, has been developed and applied. Meanwhile, as a next-generation read head capable of high-speed operation with a small resistance, a CPP-GMR (Current Perpendicular to the Plane-Giant Magnetoresistance) sensor, in which a current is applied perpendicularly to the film structure of GMR, has been researched and developed.

CPP-GMR devices generally comprise a laminate of a free layer, an intermediate layer, and a pinned layer, and the pinned layer is substantially fixed to a magnetic field to be detected by exchange coupling with an antiferromagnetic film or a like method. The magnetically secured pinned layer is stable to an external magnetic field, and only the magnetic orientation of the free layer is affected by the external magnetic field. At this time, generally, the resistance is lowest when the angle formed by the free layer and the pinned layer is 0°, and is highest when the angle is 180°. Defining the resistance change to the magnetic field angle as a magnetoresistance ratio (MR ratio=$(R_{max}-R_{min})/R_{min}$), the MR ratio of conventionally employed CPP-GMR using a CoFe alloy or an NiFe alloy is about 5% at most.

In order to increase the MR ratio of CPP-GMR devices, use of a material having large interface scattering and bulk scattering coefficients for a ferromagnetic layer of CPP-GMR has been reported. Japanese Patent No. 3607678 discloses that among Heusler alloys having a large product of bulk scattering coefficient ($\beta$)×specific resistance ($\rho$), particularly use of $Co_2MnZ$ (Z=Al, Si, Ga, Ge, Sn) for a free layer or a pinned layer greatly improves the MR ratio. Japanese Patent Application Pub. No. JP-A-2007-88415 discloses that use of Co—Fe—Al (50 at. %<Co<70 at. %, 10 at. %<Fe<25 at. %, 15 at. %<Al<30 at. %) for a ferromagnetic layer increases the MR ratio than in the case of Co—Fe.

Meanwhile, as another method for increasing MR ratio, Japanese Patent Application Pub. No. JP-A-2002-208744 proposes a structure having, in an intermediate layer, a current confinement layer provided with a metal path.

Incidentally, when a CPP-GMR sensor or the like is used as a magnetoresistive magnetic head, the output voltage is proportional to MR ratio×bias voltage. It thus is preferable to increase the applied voltage higher than the bias voltage (5 to 20 mV) usually used for measuring MR ratio, and use the head at a voltage that results in a high output.

However, when the voltage applied to an element is increased, the following problems will occur. Specifically, when the voltage applied to an element, i.e., a current, is increased, spin-polarized electrons are transmitted in a direction opposite to the direction of voltage application, from a pinned layer to a free layer or from a free layer to a pinned layer. At this time, the magnetization of the free layer or the pinned layer tilts due to spin torque. The problem is that because spin torque increases with an increase in the voltage, consequently, the MR ratio decreases with an increase in the bias voltage.

in particular, although CPP-GMR using Co—Mn—Z (Z=Al, Si, Ge) or a like Heusler alloy, which is a high-spin scattering material, for the pinned layer/free layer gives large MR ratio at a low bias voltage, the bias voltage dependence of MR ratio is greater as compared with CPP-GMR using Co—Fe, and there is a problem in that at a driving voltage, the resulting output voltage is smaller than expected from the MR ratio at a low bias. That is, it has been revealed that when a Heusler alloy, a high-spin scattering material, is simply used for a free layer and a pinned layer, although large MR ratio can be obtained at a low bias voltage, as a magnetoresistive element and a magnetoresistive magnetic head, a large output voltage cannot be expected.

SUMMARY OF THE INVENTION

A magnetoresistive magnetic head according to one embodiment uses a current-perpendicular-to-plane magnetoresistive element having a laminate of a free layer, an intermediate layer, and a pinned layer, the pinned layer being substantially fixed to a magnetic field to be detected, wherein either the pinned layer or the free layer includes a Heusler alloy layer represented by a composition of X—Y—Z, wherein X is between about 45 at. % and about 55 at. % and is Co or Fe, Y accounts for between about 20 at. % and about 30 at. % and is one or more elements selected from V, Cr, Mn, and Fe, and Z is between about 20 at. % and about 35 at. % and is one or more elements selected from Al, Si, Ga, Ge, Sn, and Sb, the other layer including a high saturation magnetization material layer having higher saturation magnetization than that of the Heusler alloy, and where the direction of the current flowing perpendicular to plane being a direction in which an electron flows from the Heusler alloy layer into the high saturation magnetization material layer.

A magnetoresistive magnetic head according to another embodiment uses a current-perpendicular-to-plane magnetoresistive element having a laminate of a free layer, an intermediate layer, and a pinned layer, the pinned layer being substantially fixed to a magnetic field to be detected, where either the pinned layer or the free layer includes a Heusler alloy layer represented by the composition of X—Y—Z, wherein X is between about 45 at. % and about 55 at. % and is Co or Fe, Y accounts for between about 20 at. % and about 30 at. % and is one or more elements selected from V, Cr, Mn, and Fe, and Z is between about 20 at. % and about 35 at. % and is one or more elements selected from Al, Si, Ga, Ge, Sn, and Sb, the other layer including a layer of Co—Fe-M or Co—Fe, wherein M is one or more elements selected from Al, Si, Mn, Ge, Ga, Sn, Sb, Dy, Tb, Ho, and Er.

A magnetoresistive magnetic head according to yet another embodiment uses a current-perpendicular-to-plane magnetoresistive element having a laminate of a free layer, an intermediate layer, and a pinned layer, the pinned layer being substantially fixed to a magnetic field to be detected, where either the pinned layer or the free layer including a Heusler alloy layer represented by the composition of X—Y—Z, wherein X is between about 45 at. % and about 55 at. % and is Co or Fe, Y is between about 20 at. % and about 30 at. % and is one or more elements selected from V, Cr, Mn, and Fe, and Z is between about 20 at. % and about 35 at. % and is one or more elements selected from Al, Si, Ga, Ge, Sn, and Sb, the other layer including a Heusler alloy layer with a smaller Z composition than that of the Heusler alloy.

A magnetoresistive magnetic head according to yet another embodiment uses a current-perpendicular-to-plane magnetoresistive element having a laminate of a free layer, an intermediate layer, and a pinned layer, the pinned layer being substantially fixed to a magnetic field to be detected, where both the pinned layer and the free layer each including a film comprising a laminate of a Heusler alloy layer represented by the composition of X—Y—Z and a Co—Fe layer, wherein X is between about 45 at. % and about 55 at. % and is Co or Fe, Y is between about 20 at. % and about 30 at. % and is one or more elements selected from V, Cr, Mn, and Fe, and Z is between about 20 at. % and about 35 at. % and is one or more elements selected from Al, Si, Ga, Ge, Sn, and Sb, the Co—Fe layers included in the pinned layer and the free layer having different total thicknesses, the direction of the current perpendicular to plane being a direction in which an electron flows from the side where the Heusler alloy layer and the Co—Fe layer with lower average saturation magnetization are laminated into the side where the Heusler alloy layer and the Co—Fe layer with higher average saturation magnetization are laminated.

Any of these embodiments may be implemented in a magnetic data storage system such as a disk drive system, which may include a magnetic head, a drive mechanism for passing a magnetic medium (e.g., hard disk) over the magnetic head, and a controller electrically coupled to the magnetic head.

Other aspects and advantages of the present invention will become apparent from the following detailed description, which, when taken in conjunction with the drawings, illustrate by way of example the principles of the invention.

DETAILED DESCRIPTION

Figure 1:
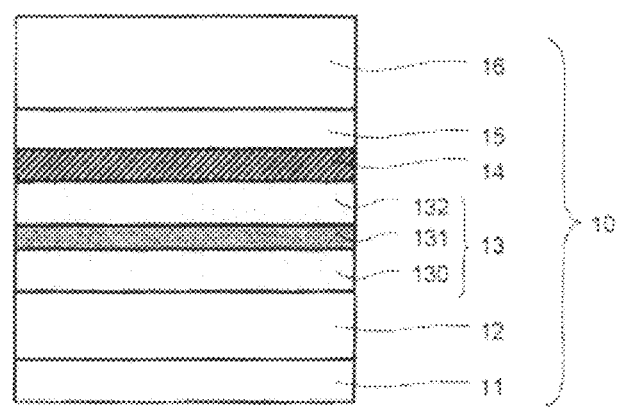
FIG. 1 shows the laminate structure of one example of the magnetoresistive film of the invention.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

Various embodiments of the present invention are aimed at solving the above-mentioned problems. Accordingly, some embodiments combine high MR ratio with high bias voltage resistance in a magnetoresistive element and a magnetoresistive magnetic head, and/or provide a magnetoresistive element that produces an increased output voltage or provide a magnetic head having the same.

A magnetoresistive magnetic head according to one general embodiment uses a current-perpendicular-to-plane magnetoresistive element having a laminate of a free layer, an intermediate layer, and a pinned layer, the pinned layer being substantially fixed to a magnetic field to be detected, wherein either the pinned layer or the free layer includes a Heusler alloy layer represented by a composition of X—Y—Z, wherein X is between about 45 at. % and about 55 at. % and is Co or Fe, Y accounts for between about 20 at. % and about 30 at. % and is one or more elements selected from V, Cr, Mn, and Fe, and Z is between about 20 at. % and about 35 at. % and is one or more elements selected from Al, Si, Ga, Ge, Sn, and Sb, the other layer including a high saturation magnetization material layer having higher saturation magnetization than that of the Heusler alloy, and where the direction of the current flowing perpendicular to plane being a direction in which an electron flows from the Heusler alloy layer into the high saturation magnetization material layer.

A magnetoresistive magnetic head according to another general embodiment uses a current-perpendicular-to-plane magnetoresistive element having a laminate of a free layer, an intermediate layer, and a pinned layer, the pinned layer being substantially fixed to a magnetic field to be detected, where either the pinned layer or the free layer includes a Heusler alloy layer represented by the composition of X—Y—Z, wherein X is between about 45 at. % and about 55 at. % and is Co or Fe, Y accounts for between about 20 at. % and about 30 at. % and is one or more elements selected from V, Cr, Mn, and Fe, and Z is between about 20 at. % and about 35 at. % and is one or more elements selected from Al, Si, Ga, Ge, Sn, and Sb, the other layer including a layer of Co—Fe-M or Co—Fe, wherein M is one or more elements selected from Al, Si, Mn, Ge, Ga, Sn, Sb, Dy, Tb, Ho, and Er.

A magnetoresistive magnetic head according to yet another general embodiment uses a current-perpendicular-to-plane magnetoresistive element having a laminate of a free layer, an intermediate layer, and a pinned layer, the pinned layer being substantially fixed to a magnetic field to be detected, where either the pinned layer or the free layer including a Heusler alloy layer represented by the composition of X—Y—Z, wherein X is between about 45 at. % and about 55 at. % and is Co or Fe, Y is between about 20 at. % and about 30 at. % and is one or more elements selected from V, Cr, Mn, and Fe, and Z is between about 20 at. % and about 35 at. % and is one or more elements selected from Al, Si, Ga, Ge, Sn, and Sb, the other layer including a Heusler alloy layer with a smaller Z composition than that of the Heusler alloy.

A magnetoresistive magnetic head according to yet another general embodiment uses a current-perpendicular-to-plane magnetoresistive element having a laminate of a free layer, an intermediate layer, and a pinned layer, the pinned layer being substantially fixed to a magnetic field to be detected, where both the pinned layer and the free layer each including a film comprising a laminate of a Heusler alloy layer represented by the composition of X—Y—Z and a Co—Fe layer, wherein X is between about 45 at. % and about 55 at. % and is Co or Fe, Y is between about 20 at. % and about 30 at. % and is one or more elements selected from V, Cr, Mn, and Fe, and Z is between about 20 at. % and about 35 at. % and is one or more elements selected from Al, Si, Ga, Ge, Sn, and Sb, the Co—Fe layers included in the pinned layer and the free layer having different total thicknesses, the direction of the current perpendicular to plane being a direction in which an electron flows from the side where the Heusler alloy layer and the Co—Fe layer with lower average saturation magnetization are laminated into the side where the Heusler alloy layer and the Co—Fe layer with higher average saturation magnetization are laminated.

The present inventors conducted research on the relation between the bias voltage dependence of MR ratio and various magnetic materials. As a result, they found that the bias voltage resistance of MR ratio is correlated with saturation magnetization of a magnetic material on the side where an electron flows in at a certain driving voltage.

Specifically, when a magnetoresistive element is structured so that either the free layer or the pinned layer includes a high-spin scattering material layer, such as a Heusler alloy, and the other layer includes a high saturation magnetization material layer, and a voltage is applied so that an electron flows in from the high-spin scattering material layer to the high saturation magnetization material, high MR ratio and high bias voltage resistance can be performed together. As used herein, a Heusler alloy is a material that is represented by the composition of X—Y—Z (where X accounts for not less than 45 at. % and not more than 55 at. % and is Co or Fe, Y accounts for not less than 20 at. % and not more than 30 at. % and is one or more elements selected from V, Cr, Mn, and Fe, Z accounts for not less than 20 at. % and not more than 35 at. % and is one or more elements selected from Al, Si, Ga, Ge, Sn, and Sb) and has a crystal structure of L21, D03, or B2.

As a high saturation magnetization material, Co—Fe-M (where M is one or more elements selected from Al, Si, Mn, Ge, Ga, Sn, Sb, Dy, Tb, Ho, and Er) or a Heusler alloy (X'—Y'—Z') with a smaller Z composition (Z') than that of the above Heusler alloy is preferable.

The bias voltage dependence of MR ratio mainly arises from the free layer and the pinned layer, and is not dependent on an intermediate layer. As an intermediate layer, a non-magnetic conductive layer made of Cu, Cr, Ag, Au, or the like may be used. In addition, a current confinement layer having a metal path made of Cu, Cr, Ag, Au, Co, or the like in an insulating material layer or an insulating layer made of MgO, Al—Ox, Ti—Ox, or the like may also be used.

According to one example of a magnetoresistive element according to one embodiment of the present invention, Co—Fe-M (where M is one or more elements selected from Al, Si, Mn, Ge, Ga, Sn, Sb, Dy, Tb, Ho, and Er) is used for at least part of the material layer on a higher saturation magnetization side, whereby the bias dependence of MR ratio can be improved compared with the case where Heusler alloy layers of the same composition are used for both the free layer and the pinned layer. When a voltage is applied so that an electron flows from the Heusler alloy layer into the Co—Fe-M layer, a higher output can be obtained than in the conventional structure that contains X—Y—Z in both a free layer and a pinned layer.

Further, according to another embodiment of the present invention, a material with a smaller Z composition than that of the above Heusler alloy is used for at least part of the material on a higher saturation magnetization side. Accordingly, when a driving voltage is applied so that an electron enters the Heusler alloy layer with a smaller Z composition from the Heusler alloy layer with a larger Z composition, the bias voltage dependence of MR ratio can be improved while maintaining a strong bulk scattering effect. In comparison with the case where a Heusler alloy of the same composition is used for both the free layer and the pinned layer, a higher output can be obtained at the driving voltage.

According to various embodiments of the present invention, an increased MR ratio can be achieved at the driving voltage of an element, and a magnetoresistive element for a high-output CPP-GMR head and a magnetic head can be provided.

First, an illustrative method for producing a magnetoresistive film that forms a magnetoresistive magnetic head is explained. The magnetoresistive film according to this approach was formed on a ceramic substrate using a DC magnetron sputtering apparatus. The formed film was heat-treated in the vacuum magnetic field at 250° C. for 3 hours, and one-directional magnetic anisotropy of an MnIr antiferromagnetic film was induced. A liftoff process was employed for the formation of a magnetoresistive element. For measuring the magnetization and MR of the produced magnetoresistive film and element, a vibrating sample magnetometer was used and a 4-probe method was employed, respectively.

A cross-sectional structure of a typical magnetoresistive film of some embodiments of the present invention is shown in FIG. 1. The magnetoresistive film 10 comprises a laminate of an underlayer 11, an antiferromagnetic layer 12, a pinned layer 13 having a first ferromagnetic pinned layer 130, an antiparallel coupling intermediate layer 131, and a second ferromagnetic pinned layer 132, an intermediate layer 14, a free layer 15, and a protection layer 16, and has a Heusler alloy layer in either or both the pinned layer and the free layer.

The intermediate layer 14 has a structure that magnetically separates the pinned layer 13 and the free layer 15 and also produces magneto-resistive effects for scattering, transmitting, or reflecting electrons that pass between the pinned layer 13 and the free layer 15 depending on the magnetization state of the pinned layer 13 and the free layer 15. The intermediate layer may be a non-magnetic conductive layer that has giant magneto-resistive effects, made of Cu, Cr, Ag, Au, or a like material, and may also be a current confinement layer having a metal path, an insulating layer made of MgO, Al—Ox, Ti—Ox, or the like.

The pinned layer 13 having the first ferromagnetic pinned layer 130, the antiparallel coupling intermediate layer 131, and the second ferromagnetic pinned layer 132 is magnetically secured by the antiferromagnetic layer 12, so that the magnetization is substantially fixed to the magnetic field to be detected. The pinned layer 13 having the first ferromagnetic pinned layer 130, the antiparallel coupling intermediate layer 131, and the second ferromagnetic pinned layer 132 is called an antiparallel coupling pinned layer, and is stable to an external magnetic field. This thus is a preferable structural example of an embodiment of the present invention. However, the pinned layer 13 may be a monolayer film or may also be a laminated film having two or more magnetic layers. For the antiparallel coupling intermediate layer, Ru or the like is used, for example. When a Heusler alloy is used for the pinned layer 13 or the second ferromagnetic pinned layer 132, such a Heusler alloy layer is preferably sandwiched between thin CoFe, Co layers, or the like, for this promotes crystallization of the Heusler alloy layer and also suppresses interfacial diffusion. Further, when forming the Heusler alloy, heat treatment is preferably performed at 200 to 400° C. to promote ordering, so that the Heusler alloy has a crystal structure of L21 structure, D03 structure, or B2 structure. However, even in the case where the above heat treatment is not employed, if heat treatment is performed at a temperature of 250° C. or more when inducing one-directional magnetic anisotropy of an MnIr antiferromagnetic film, a 132 structure or a higher order can be obtained.

Although this is not illustrated, the free layer 15 may be a laminate of two or more kinds of thin films. The free layer 15 may also be an antiparallel coupling free layer having, starting from the intermediate layer side, a first ferromagnetic free layer, an antiparallel coupling intermediate layer, and a second ferromagnetic free layer. When a Heusler alloy is used, the layer is preferably sandwiched between CoFe or Co.

The antiferromagnetic layer 12 serves to secure the magnetization of a pinned layer or an antiparallel coupling pinned layer in one direction, and MnIr, MnIrCr, MnPt, and the like are used therefor, for example.

Although the underlayer 11 is not an indispensable constituent of the magnetoresistive element 10, use thereof improves the crystallinity and magnetic properties of the magnetoresistive laminated film, and thus is preferable. Similarly, although this may not be an indispensable constituent of the magnetoresistive element 10, disposition of the protective layer 16 in the upper part of the magnetoresistive laminated film 10 prevents unexpected oxidation or corrosion, and thus is preferable.

The characteristic features of some embodiments of the present invention are described hereinafter. Usually, for at least part of each of a pinned layer and a free layer that are in contact with an intermediate layer, a Heusler alloy of the same composition represented by X—Y—Z (X accounts for not less than 45 at. % and not more than 55 at. % and is Co or Fe, Y accounts for not less than 20 at. % and not more than 30 at. % and is one or more elements, selected from V, Cr, Mn, and Fe, and Z accounts for not less than 20 at. % and not more than 35 at. % and is one or more elements selected from Al, Si, Ga, Ge, Sn, and Sb) is used. In contrast, according to embodiments of the present invention, at least either the pinned magnetic layer or the free magnetic layer includes a layer of the above Heusler alloy. Further, for one magnetic layer, Co—Fe-M with higher saturation magnetization than in the other magnetic layer (M is one or more elements selected from Al, Si, Mn, Ge, Ga, Sn, Sb, Dy, Tb, Ho, and Er) or X'—Y'—Z' with a smaller Z composition than that of the above Heusler alloy (X' accounts for not less than 45 at. % and not more than 55 at. % and is Co or Fe, Y' accounts for not less than 20 at. % and not more than 30 at. % and is one or more elements selected from V, Cr, Mn, and Fe, and Z' accounts for not less than 20 at. % and not more than 35 at. % satisfying Z'<Z, and is one or more elements selected from Al, Si, Ga, Ge, Sn, and Sb) is used. This is a major characteristic. Due to such a structure, when a driving voltage is applied so that an electron flows from the magnetic layer with lower saturation magnetization into the magnetic layer with higher saturation magnetization, higher MR ratio can be achieved than in the conventional structure containing X—Y—Z in both the free layer and the pinned layer, and a high output voltage can be obtained as a result.

The reason that such a high output voltage is obtained is as follows. The saturation magnetization of a Heusler alloy, such as $Co_2MnSi$ or $Co_2MnGe$, is about 1.2 T at most and thus is weak to spin torque. In a magnetoresistive element using such an alloy for both the free layer and the pinned layer, MR ratio greatly decreases with an increase in voltage. Thus, either the free layer or the pinned layer includes a high saturation magnetization material layer, and a driving voltage is applied so that an electron flows from the Heusler alloy layer into the high saturation magnetization layer, whereby the bias voltage dependence of MR ratio can be improved. In particular, when the above Co—Fe-M or X'—Y'—Z' with a smaller Z composition is used as a material with higher saturation magnetization, even if the MR ratio at low bias is the same as or slightly lower than in the conventional structure, the bias voltage dependence is greatly improved, resulting in an increased MR ratio at the driving voltage where electrons enter these layers, whereby the output voltage can be increased.

The magnetoresistive element according to various embodiments of the present invention can be applied not only to a magnetoresistive magnetic head but also to a magnetic random access memory (MRAM). Specific experimental examples of various embodiments are described in detail hereinafter.

Experimental Example 1

Table 1 shows the laminate structure and the thickness of an example of the magnetoresistive film according to one embodiment.

TABLE 1

| Structure of Magnetoresistive Film | | Material | Thickness (nm) |
|---|---|---|---|
| | Cap layer | Ru | 7.0 |
| | | Cu | 2.0 |
| | Free layer | Free layer | 3.0 |
| Intermediate layer | Current confinement layer | AlCu—O | 0.7 |
| | Current path forming layer | Cu | 0.5 |
| Pinned layer | Second ferromagnetic pinned layer | Second pinned layer | 3.0 |
| | Antiparallel coupling intermediate layer | Ru | 0.8 |
| | First ferromagnetic pinned layer | CoFe | 3.0 |
| | Antiferromagnetic layer | MnIr | 6.0 |
| | Underlayer | Ru | 2.0 |
| | | Ta | 3.0 |

The pinned layer was formed to have the structure of an antiparallel coupling pinned layer having a first ferromagnetic pinned layer, an antiparallel coupling intermediate layer, and a second ferromagnetic pinned layer (second pinned layer). The intermediate layer was formed to serve as a current confinement layer having a Cu nano-current path. Here, the combination of a second pinned layer and a free layer and the current flow direction are critical aspects of various embodiments of the present invention, and thus are explained in Table 2 in further detail.

In addition, when Ge, Ga, Sn, or Sb, which is an element of the same family or same metalloid as Al and Si, is used, and

TABLE 2

| | Second pinned layer | Saturation magnetization (T) | Free layer | Saturation magnetization (T) | MR (%) | V80− (mV) | V80+ (mV) | (MR × V) max (mV) | Electron flow at maximum output |
|---|---|---|---|---|---|---|---|---|---|
| Experimental Example 1-1 | Co52Mn22Ge26 | 1.0 | Co50Fe50 | 2.2 | 11.8 | 112 | 42 | 9.9 | Pinned → Free |
| Experimental Example 1-2 | Co52Mn22Ge26 | 1.0 | Co45Fe45Al10 | 2.0 | 12.7 | 108 | 40 | 10.5 | Pinned → Free |
| Experimental Example 1-3 | Co52Mn22Ge26 | 1.0 | Co45Fe45Si10 | 1.9 | 13.5 | 95 | 43 | 10.6 | Pinned → Free |
| Experimental Example 1-4 | Co52Mn22Ge26 | 1.0 | Co45Fe45Mn10 | 2.0 | 12.2 | 107 | 45 | 10.1 | Pinned → Free |
| Experimental Example 1-5 | Co50Fe50 | 2.2 | Co52Mn22Ge26 | 0.9 | 12.1 | 48 | 119 | 10.4 | Free → Pinned |
| Experimental Example 1-6 | Co45Fe45Al10 | 2.0 | Co52Mn22Ge26 | 0.9 | 13.1 | 42 | 107 | 10.9 | Free → Pinned |
| Experimental Example 1-7 | Co45Fe45Si10 | 1.9 | Co52Mn22Ge26 | 0.9 | 13.4 | 44 | 104 | 11.3 | Free → Pinned |
| Experimental Example 1-8 | Co45Fe45Mn10 | 2.0 | Co52Mn22Ge26 | 0.9 | 12.3 | 43 | 104 | 1.0 | Free → Pinned |
| Experimental Example 1-9 | Co52Mn22Ge26 | 1.0 | Co52Mn22Ge26 | 0.9 | 15.5 | 43 | 45 | 9.8 | Free → Pinned |

Figure 2:
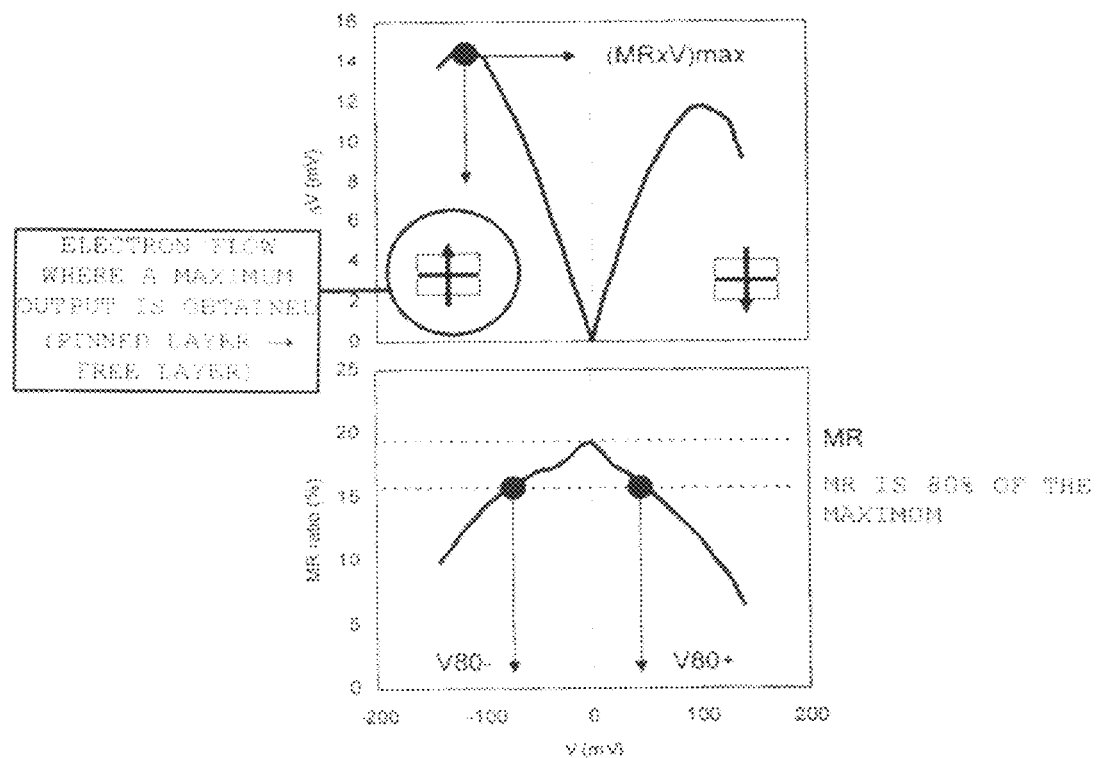
FIG. 2 shows a method for evaluating the characteristics of the magnetoresistive element of the invention.

Experimental Examples 1-1 to 1-8 in Table 2 show, with respect to a magnetoresistive element in which Co—Mn—Ge is used for either the second pinned layer or the free layer and Co—Fe or Co—Fe-M (M=Al, Si, Mn) is used for the other layer, the saturation magnetization of the second pinned layer and the free layer, the MR ratio (MR) at an applied voltage of 10 mV, the voltage when the MR ratio decreases to 80% of the maximum (V80), the maximum output value ((MR×V)max), and the direction of electron flow when the maximum output value is obtained. Values other than saturation magnetization were evaluated from the bias voltage dependence of MR ratio and output, as shown in FIG. 2. V80 introduced here is a criterion for the bias voltage resistance of MR ratio. The greater the value, the higher the bias voltage resistance, indicating that large MR ratio can be maintained to a higher bias voltage. In Experimental Example 1-9, Co—Mn—Ge was used for both the second pinned layer and the free layer. Here, when the voltage is positive, an electron moves in the direction from the free layer to the pinned layer, while when the voltage is negative, an electron moves in the direction from the pinned layer to the free layer.

Comparing Experimental Examples 1-1 to 1-4 with Experimental Example 1-9, while V80+ is comparable to the comparative example, a remarkable improvement in V80− is observed in Experimental Examples 1-1 to 1-4. This is because the saturation magnetization of the free layer is higher than in the conventional structure, and thus the bias voltage dependence of MR ratio is improved at a negative bias voltage where an electron transmits from the pinned layer to the free layer. On the other hand, the MR ratio at low bias is slightly inferior compared to Experimental Example 1-9. However, because the improvement in V80− is great, as a result, when the bias voltage is negative (structure in which an electron flows from the pinned layer into the free layer), the output voltage (MR×V) can be increased more than before. On the contrary, because the saturation magnetization of the second pinned layer is large in Experimental Examples 1-5 to 1-8, V80+ can be improved. Thus, when the bias voltage is positive, the output voltage can be increased more than before.

also when Tb, Ho, or Er is used as M, high spin scattering efficiency and high bias voltage resistance of MR ratio can be performed together, and when a driving voltage is applied so that an electron flows from the magnetic layer with lower saturation magnetization into the magnetic layer with higher saturation magnetization, the output voltage can be increased.

Although Experimental Example 1 only shows the results of using Co—Mn—Ge as a Heusler alloy for a second pinned layer or a free layer, the same results were obtained when the composition was represented by X—Y—Z, wherein X is Co or Fe that satisfies 45 at. %≦X≦55 at. %, Y is one or more elements selected from V, Cr, Mn, and Fe that satisfy 20 at. %≦Y≦30 at. %, and Z is one or more elements selected from Al, Si, Ga, Ge, Sn, and Sb that satisfy 20 at. %≦Z≦35 at. %.

Further, although the above results are results of using an AlCu—Ox current confinement layer for an intermediate layer, because the free layer and the pinned layer are the main factors of the bias voltage dependence of MR ratio, the same effects are provided also from a magnetoresistive element in which a non-magnetic conductive layer made of Cu, Ag, Au, Cr, or the like or an insulating layer made of MgO, Al—Ox, Ti—Ox, or the like is used for the intermediate layer.

Experimental Example 2

Table 3 shows an example of the laminate structure and the thickness of a magnetoresistive film, according to a different embodiment than that of Experimental Example 1.

TABLE 3

| Structure of Magnetoresistive Film | | Material | Thickness (nm) |
|---|---|---|---|
| Cap layer | | Ru | 7.0 |
| | | Cu | 2.0 |
| Free layer | | CoFe | 0.5 |
| | | Intermediate free layer | 3.0 |
| | | CoFe | 0.5 |
| Intermediate layer | Current confinement layer | AlCu—O | 0.7 |
| | Current path forming layer | Cu | 0.5 |

TABLE 3-continued

| Structure of Magnetoresistive Film | | Material | Thickness (nm) |
|---|---|---|---|
| Pinned layer | Second ferromagnetic pinned layer | CoFe | 0.5 |
| | | Intermediate pinned layer | 3.0 |
| | | CoFe | 0.5 |
| | Antiparallel coupling intermediate layer | Ru | 0.8 |
| | First ferromagnetic pinned layer | CoFe | 3.0 |
| Antiferromagnetic layer | | MnIr | 6.0 |
| Underlayer | | Ru | 2.0 |
| | | Ta | 3.0 |

The pinned layer was formed to have the structure of an antiparallel coupling pinned layer having a first ferromagnetic pinned layer, an antiparallel coupling intermediate layer, and a second ferromagnetic pinned layer. Further, the second ferromagnetic pinned layer was formed as CoFe/intermediate pinned layer/CoFe. Similarly, the free layer was formed as CoFe/intermediate free layer/CoFe. The intermediate layer was formed to serve as a current confinement layer having a Cu nano-current path. Here, the combination of an intermediate pinned layer and an intermediate free layer and the current flow direction are critical to various embodiments of the present invention, and thus are explained in Table 4 in further detail.

Experimental Examples 2-1 to 2-8 in Table 4 show, with respect to a magnetoresistive element in which Co—Mn—Ge is used for either the intermediate pinned layer or the intermediate free layer and Co—Fe—Si is used for the other layer, the saturation magnetization of the intermediate pinned layer and the intermediate free layer, the MR ratio (MR) at an applied voltage of 10 mV, the voltage when the MR ratio decreases to 80% of the maximum (V80), the maximum output value ((MR×V)max), and the direction of electron flow when the maximum output value is obtained. Other film structures were as shown in Table 3. The Si concentration of Co—Fe—Si was kept constant at 10 at. %, and the composition of Co—Fe was varied. Values other than saturation magnetization were evaluated from the bias voltage dependence of MR ratio and output, as shown in FIG. 2. V80 introduced here is a criterion for the bias voltage resistance of MR ratio. The greater the value, the higher the bias voltage resistance, indicating that large MR ratio can be maintained to a higher bias voltage. Experimental Example 2-9 shows the case where Co—Mn—Ge was used for both the intermediate pinned layer and the intermediate free layer. Here, when the voltage is positive, an electron moves from the free layer to the pinned layer, while when the voltage is negative, an electron moves from the pinned layer to the free layer.

TABLE 4

| | Intermediate pinned layer | Saturation magnetization (T) | Intermediate free layer | Saturation magnetization (T) | MR (%) | V80− (mV) | V80+ (mV) | (MR × V) max (mV) | Electron flow at maximum output |
|---|---|---|---|---|---|---|---|---|---|
| Experimental Example 2-1 | Co46Mn29Ge25 | 1.1 | Co72Fe18Si10 | 1.8 | 14.5 | 95 | 47 | 11.6 | Pinned → Free |
| Experimental Example 2-2 | Co46Mn29Ge25 | 1.1 | Co54Fe36Si10 | 2.0 | 15.3 | 100 | 49 | 12.3 | Pinned → Free |
| Experimental Example 2-3 | Co46Mn29Ge25 | 1.1 | Fe63Co27Si10 | 2.2 | 15.3 | 116 | 51 | 13.0 | Pinned → Free |
| Experimental Example 2-4 | Co46Mn29Ge25 | 1.1 | Fe81Co9Si10 | 2.0 | 15.5 | 105 | 48 | 12.8 | Pinned → Free |
| Experimental Example 2-5 | Co72Fe18Si10 | 1.8 | Co46Mn29Ge25 | 1.0 | 14.1 | 48 | 97 | 11.3 | Free → Pinned |
| Experimental Example 2-6 | Co54Fe36Si10 | 2.0 | Co46Mn29Ge25 | 1.0 | 15.1 | 51 | 102 | 12.3 | Free → Pinned |
| Experimental Example 2-7 | Fe63Co27Si10 | 2.2 | Co46Mn29Ge25 | 1.0 | 15.7 | 53 | 122 | 13.6 | Free → Pinned |
| Experimental Example 2-8 | Fe81Co9Si10 | 2.1 | Co46Mn29Ge25 | 1.0 | 15.3 | 52 | 110 | 12.8 | Free → Pinned |
| Experimental Example 2-9 | Co46Mn29Ge25 | 1.1 | Co46Mn29Ge25 | 1.0 | 17.5 | 45 | 47 | 11.1 | Free → Pinned |

In a magnetoresistive element of Experimental Example 2-9 in which Co—Mn—Ge is used for the intermediate pinned layer and the intermediate free layer, both V80− and V80+ are as small as about 50 mV. On the contrary, as shown in Experimental Examples 2-1 to 2-8, when Co—Fe—Si is used for either the intermediate pinned layer or the intermediate free layer, an improvement in either V80+ or V80− is observed compared with the case of Co—Mn—Ge in Experimental Example 2-9. This is because the saturation magnetization of the intermediate pinned layer or the intermediate free layer using Co—Fe—Si is larger than that of Co—Mn—Ge, and when a bias voltage is applied so that an electron flows from Co—Mn—Ge into Co—Fe—Si, a decrease in MR ratio due to spin torque is suppressed. Further, at this bias voltage, a larger output voltage is obtained than in Experimental Example 2-9. As shown above, regardless of the composition ratio between Co and Fe in Co—Fe—M, when the saturation magnetization of Co—Fe-M is higher than that of Co—Mn—Ge, the output voltage can be increased. Although the results obtained when M is Si are only shown herein, the same results are obtained also when Al, Mn, Ge, Ga, Sn, Sb, Dy, Tb, Ho, or Er is used for M, regardless of the composition ratio of Co—Fe.

Although Experimental Example 2 only shows the results of using Co—Mn—Ge for an intermediate free layer, the same results were obtained when using, for the intermediate free layer, a Heusler alloy layer having a composition represented by X—Y—Z, wherein X is Co or Fe that satisfies 45 at.

%≦X≦55 at. %, Y is one or more elements selected from V, Cr, Mn, and Fe that satisfy 20 at. %≦Y≦30 at. %, and Z is one or more elements selected from Al, Si, Ga, Ge, Sn, and Sb that satisfy 20 at. %≦Z≦35 at. %.

Further, although the above results are results of using an AlCu—Ox current confinement layer for an intermediate layer, because the free layer and the pinned layer are the main factors of the bias voltage dependence of MR ratio, the same effects are provided also from a magnetoresistive element in which a non-magnetic conductive layer made of Cu, Ag, Au, Cr, or the like or an insulating layer made of MgO, Al—Ox, Ti—Ox, or the like is used for the intermediate layer.

Experimental Example 3

Experimental Examples 3-1 to 3-8 in Table 5 present experimental examples using Co—Mn—Ge for the intermediate pinned layer and Co—Fe-M (M=Al, Si, Dy, Mn, Ge) for the intermediate free layer of Table 3, and show the saturation magnetization of the intermediate pinned layer and the intermediate free layer, the MR ratio (MR) at an applied voltage of 10 mV, the voltage when the MR ratio decreases to 80% of the maximum (V80), the maximum output value ((MR×V)max), and the direction of electron flow when the maximum output value is obtained. Values other than saturation magnetization were evaluated from the bias voltage dependence of MR ratio and output, as shown in FIG. 2. V80 introduced here is a criterion for the bias voltage resistance of MR ratio. The greater the value, the higher the bias voltage resistance, indicating that large MR ratio can be maintained to a higher bias voltage. Experimental Examples 3-9 to 3-10 show the cases using Co—Mn—Ge or $Co_{50}Fe_{50}$ for both the intermediate pinned layer and the intermediate free layer. Here, when the voltage is positive, an electron moves from the free layer to the pinned layer, while when the voltage is negative, an electron moves from the pinned layer to the free layer.

positive or negative, the resulting V80 is as small as half or less compared with the case of $CO_{50}Fe_{50}$, and the bias voltage dependence of MR ratio is larger than in the case of CoFe. That is, the MR ratio difference is small at a driving voltage, and the output voltage (MR×V) is obtained only about 1.2 times compared with the case of $CO_{50}Fe_{50}$.

Comparing Experimental Examples 3-1 to 3-8 with Experimental Example 3-9, while V80+ is comparable to the comparative example, a remarkable improvement is observed in V80−. This is because the saturation magnetization of the free layer is higher than in the conventional structure, and thus the bias voltage dependence of MR ratio is improved at a negative voltage where an electron transmits from the pinned layer to the free layer. On the other hand, the MR ratio at low bias is slightly inferior compared to Experimental Example 3-9. However, because the improvement in V80− is great, as a result, when the bias voltage is negative (structure in which an electron flows from the pinned layer into the free layer), the output voltage (MR×V) can be increased than before.

Figure 3:
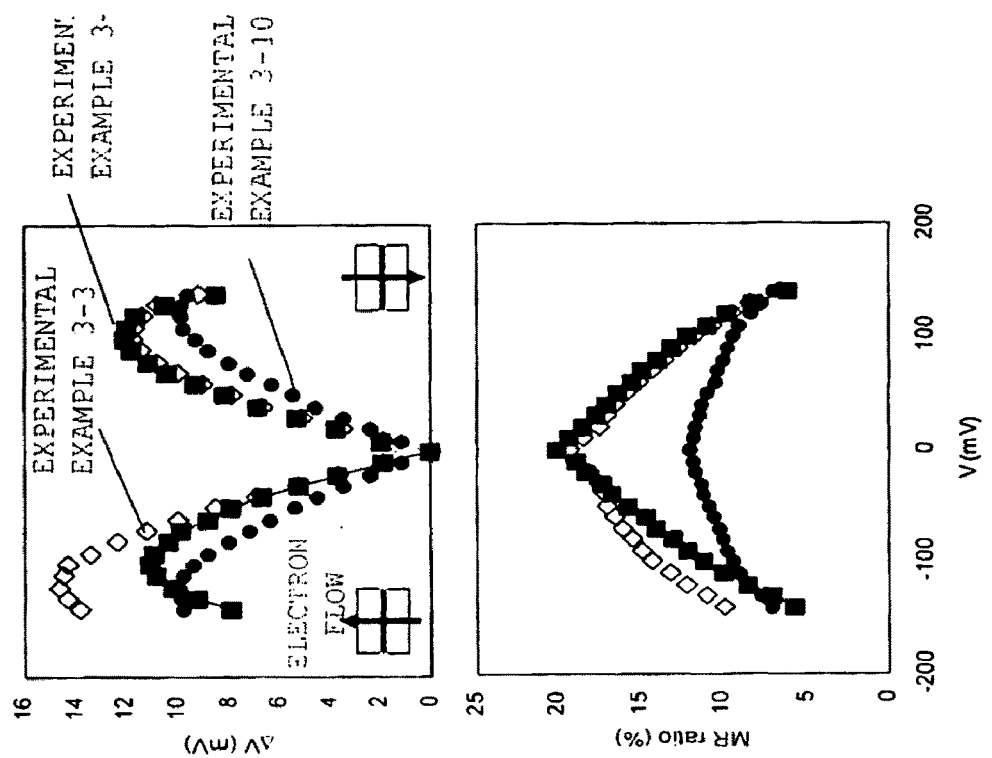
FIG. 3 shows the bias voltage dependence of MR ratio and output voltage of a typical magnetoresistive element of the invention.

The bias voltage dependences of MR ratio and output voltage (MR×V) in a typical structural example of Table 5 are shown in FIG. 3, together with Experimental Example 3-9 and Experimental Example 3-10. A maximum output value is obtained at about −100 to −130 mV or 100 to 130 mV, although this depends on the bias voltage dependence of MR ratio. The higher the MR ratio at bias voltages of this range, the larger the output. In Experimental Example 3-3, high MR ratio and high bias voltage resistance are provided together at a low bias voltage, and a larger output is obtained compared with the case of, for example, using Co—Mn—Ge for both the intermediate free layer and the intermediate pinned layer. Such an improvement in bias voltage resistance simply depends on the saturation magnetization of the magnetic material into which an electron flows, and thus can be provided not only when the composition ratio of Co and Fe is 1:1, but also in the entire composition range.

TABLE 5

| | Intermediate pinned layer | Saturation magnetization (T) | Intermediate free layer | Saturation magnetization (T) | MR (%) | V80− (mV) | V80+ (mV) | (MR × V) max (mV) | Electron flow at maximum output |
|---|---|---|---|---|---|---|---|---|---|
| Experimental Example 3-1 | Co48Mn22Ge30 | 1.0 | Co50Fe50 | 2.2 | 14.8 | 110 | 52 | 12.3 | Pinned → Free |
| Experimental Example 3-2 | Co48Mn22Ge30 | 1.0 | Co45Fe45Al10 | 2.0 | 17.3 | 106 | 47 | 13.9 | Pinned → Free |
| Experimental Example 3-3 | Co48Mn22Ge30 | 1.0 | Co40Fe10Al20 | 1.7 | 19.1 | 87 | 49 | 14.3 | Pinned → Free |
| Experimental Example 3-4 | Co48Mn22Ge30 | 1.0 | Co45Fe45Si10 | 1.9 | 17.5 | 98 | 47 | 13.9 | Pinned → Free |
| Experimental Example 3-5 | Co48Mn22Ge30 | 1.0 | Co40Fe40Si20 | 1.6 | 19.3 | 83 | 49 | 14.4 | Pinned → Free |
| Experimental Example 3-6 | Co48Mn22Ge30 | 1.0 | Co45Fe45Dy10 | 1.9 | 15.8 | 99 | 54 | 12.6 | Pinned → Free |
| Experimental Example 3-7 | Co48Mn22Ge30 | 1.0 | Co45Fe45Mn10 | 2.0 | 18.0 | 105 | 52 | 14.3 | Pinned → Free |
| Experimental Example 3-8 | Co48Mn22Ge30 | 1.0 | Co45Fe45Ge10 | 1.9 | 16.1 | 97 | 48 | 12.5 | Pinned → Free |
| Experimental Example 3-9 | Co48Mn22Ge30 | 1.0 | Co48Mn22Ge30 | 0.9 | 20.1 | 45 | 52 | 12.0 | Free → Pinned |
| Experimental Example 3-10 | Co50Fe50 | 2.2 | Co50Fe50 | 2.2 | 12.0 | 112 | 121 | 9.8 | Pinned ⇔ Free |

Figure 4:
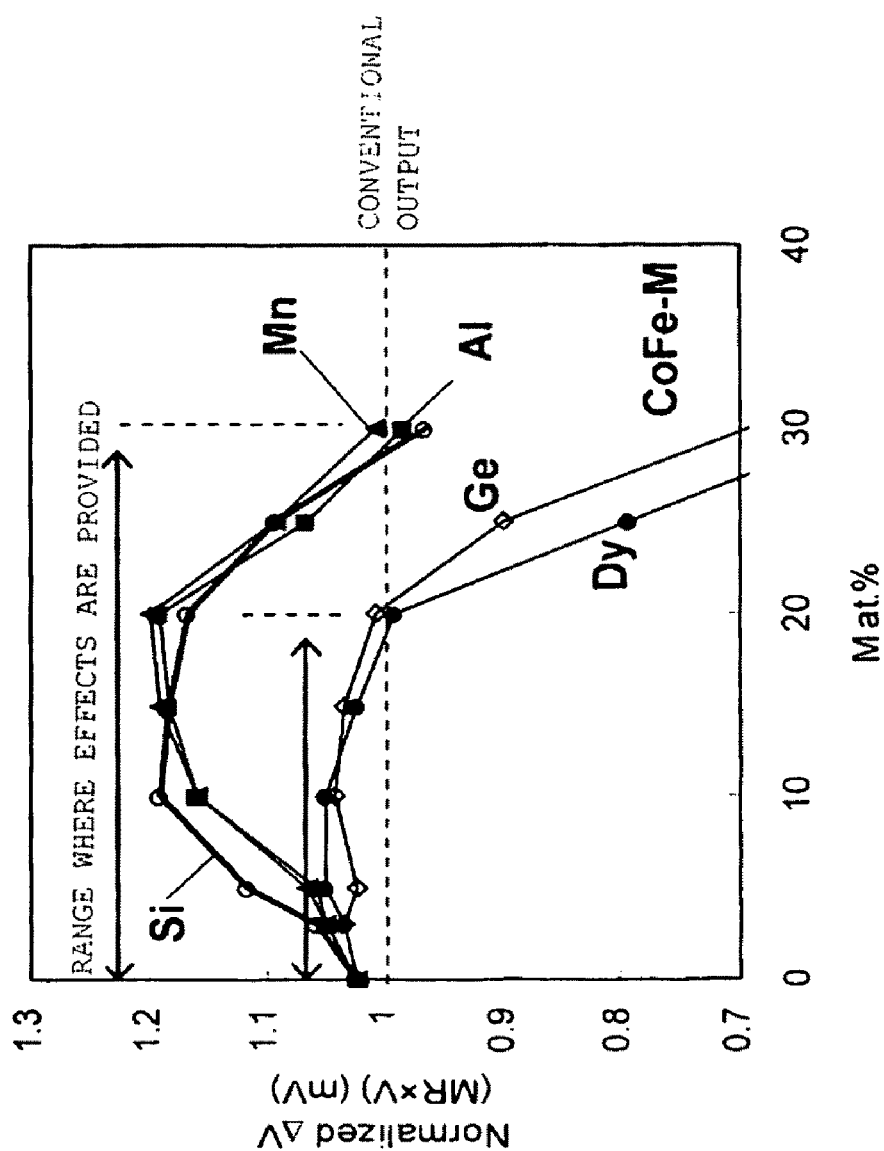
FIG. 4 shows the M-amount dependence of output voltage when using a CoFe-M intermediate free layer.

Comparing Experimental Example 3-9 with Experimental Example 3-10, in the case of a magnetoresistive element using Co—Mn—Ge, an MR ratio about 1.7 times higher than in the case of CoFe is obtained. On the other hand, in the case of using Co—Mn—Ge, no matter whether the bias voltage is FIG. 4 shows the M concentration dependence of output voltage in a magnetoresistive element in which Co—Mn—Ge is used for the intermediate pinned layer and Co—Fe-M and Co—Fe are used for the intermediate free layer, where the conventional output is taken as 1. As the conventional output herein, the output of Experimental Example 3-9 where Co—Mn—Ge was used for both the intermediate pinned layer and the intermediate free layer was employed. An increase in output is obtained when an electron flows from a pinned layer to a free layer in a magnetoresistive element where M=Al, Si, Mn, Ge, Dy. In particular, when Al, Si, or Mn is added in a proportion of 30% or less, the output voltage can be improved over the conventional structure. At this time, the output voltage can be improved by up to about 20% over the conventional structure. Further, when Ge or Dy is added as M, if the amount thereof is 20% or less, the output voltage can be improved over the conventional structure. Further, also when Co—Fe is used for the intermediate free layer, the output voltage can be improved. In addition, although this is not illustrated, when Ga, Sn, or Sb, which is an element of the same family or same metalloid as Al, Si, and Ge, was used, and also when Tb, Ho, or Er belonging to the same lanthanoid as Dy was used as M, high spin scattering efficiency and bias-voltage-dependence resistance was performed together, and improvement in output voltage was achieved.

Although Experimental Example 3 only shows the results of using Co—Mn—Ge for an intermediate pinned layer, the same results were obtained when using, for the intermediate diate free layer and Co—Fe-M (M=Al, Si, Mn, Dy, Ge) and Co—Fe for the intermediate pinned layer, and show the saturation magnetization of the intermediate pinned layer and the intermediate free layer, the MR ratio (MR) at an applied voltage of 10 mV, the voltage when the MR ratio decreases to 80% of the maximum (V80), the maximum output value ((MR×V)max), and the direction of electron flow when the maximum output value is obtained. Other film structures are as shown in Table 3. Values other than saturation magnetization were evaluated from the bias voltage dependence of MR ratio and output, as shown in FIG. 2. V80 introduced here is a criterion for the bias voltage resistance of MR ratio. The greater the value, the higher the bias voltage resistance, indicating that large MR ratio can be maintained to a higher bias voltage. Experimental Examples 3-9 to 3-10 show the cases of using Co—Mn—Ge or CoFe for both the intermediate pinned layer and the intermediate free layer. Here, when the voltage is positive, an electron moves in the direction from the free layer to the pinned layer, while when the voltage is negative, an electron moves in the direction from the pinned layer to the free layer.

TABLE 6

| | Intermediate pinned layer | Saturation magnetization (T) | Intermediate free layer | Saturation magnetization (T) | MR (%) | V80− (mV) | V80+ (mV) | (MR × V) max (mV) | Electron flow at maximum output |
|---|---|---|---|---|---|---|---|---|---|
| Experimental Example 4-1 | Co50Fe50 | 2.2 | Co48Mn22Ge30 | 0.9 | 14.6 | 49 | 115 | 12.3 | Free → Pinned |
| Experimental Example 4-2 | Co45Fe45Al10 | 2.0 | Co48Mn22Ge30 | 0.9 | 16.9 | 46 | 110 | 14.1 | Free → Pinned |
| Experimental Example 4-3 | Co40Fe40Al20 | 1.7 | Co48Mn22Ge30 | 0.9 | 18.7 | 49 | 93 | 14.1 | Free → Pinned |
| Experimental Example 4-4 | Co45Fe45Si10 | 1.9 | Co48Mn22Ge30 | 0.9 | 17.2 | 52 | 105 | 14.1 | Free → Pinned |
| Experimental Example 4-5 | Co40Fe40Si20 | 1.6 | Co48Mn22Ge30 | 0.9 | 18.8 | 44 | 85 | 14.2 | Free → Pinned |
| Experimental Example 4-6 | Co45Fe45Dy10 | 1.9 | Co48Mn22Ge30 | 0.9 | 15.5 | 48 | 102 | 12.5 | Free → Pinned |
| Experimental Example 4-7 | Co45Fe45Mn10 | 2.0 | Co48Mn22Ge30 | 0.9 | 17.7 | 44 | 107 | 14.1 | Free → Pinned |
| Experimental Example 4-8 | Co45Fe45Ge10 | 1.9 | Co48Mn22Ge30 | 0.9 | 16.1 | 49 | 102 | 12.7 | Free → Pinned |
| Experimental Example 3-9 | Co48Mn22Ge30 | 1.0 | Co48Mn22Ge30 | 0.9 | 20.1 | 45 | 52 | 12.0 | Free → Pinned |
| Experimental Example 3-10 | Co50Fe50 | 2.2 | Co50Fe50 | 2.2 | 12.0 | 112 | 121 | 9.8 | Pinned ⇔ Free | pinned layer, a Heusler alloy layer having a composition represented by X—Y—Z, wherein X is Co or Fe that satisfies 45 at. %≦X≦55 at. %, Y is one or more elements selected from V, Cr, Mn, and Fe that satisfy 20 at. %≦Y≦30 at. %, and Z is one or more elements selected from Al, Si, Ga, Ge, Sn, and Sb that satisfy 20 at. %≦Z≦35 at. %.

Further, although the above results are results of using an AlCu—Ox current confinement layer for an intermediate layer, because the free layer and the pinned layer are the main factors of the bias voltage dependence of MR ratio, the same effects were provided also from a magnetoresistive element in which a non-magnetic conductive layer made of Cu, Ag, Au, Cr, or the like or an insulating layer made of MgO, Al—Ox, Ti—Ox, or the like was used for the intermediate layer.

Experimental Example 4

Experimental Examples 4-1 to 4-8 in Table 6 present experimental examples using Co—Mn—Ge for the interme- In a magnetoresistive element of Experimental Example 3-9 in which Co—Mn—Ge is used for the intermediate pinned layer and the intermediate free layer, both V80− and V80+ are about 50 mV, and thus the bias voltage resistance is remarkably smaller as compared with the case of Experimental Example 3-10 where CoFe was used. On the contrary, as shown in Experimental Examples 4-1 to 4-8, when the intermediate pinned layer is Co—Fe-M (M=Al, Si, Dy, Mn, Ge), although not to the extent of CoFe in Experimental Example 3-10, a greater improvement in V80+ is observed compared with the case of Co—Mn—Ge in Experimental Example 3-9. The reason that V80− remains unchanged while an improvement is observed only in V80+ is that the saturation magnetization of the intermediate pinned layer is larger than the case of Co—Mn—Ge, and the reduction in MR ratio due to spin torque was suppressed. Further, in the structure shown in Experimental Examples 4-1 to 4-8, when a driving voltage is applied so that an electron flows in the direction from a free layer to a pinned layer, the resulting output voltage is larger than in Experimental Example 3-9. Such an improvement in bias voltage resistance simply depends on the saturation magnetization of the magnetic material into which an electron flows, and thus can be provided not only when the composition ratio of Co and Fe is 1:1, but also in the entire composition range.

Figure 5:
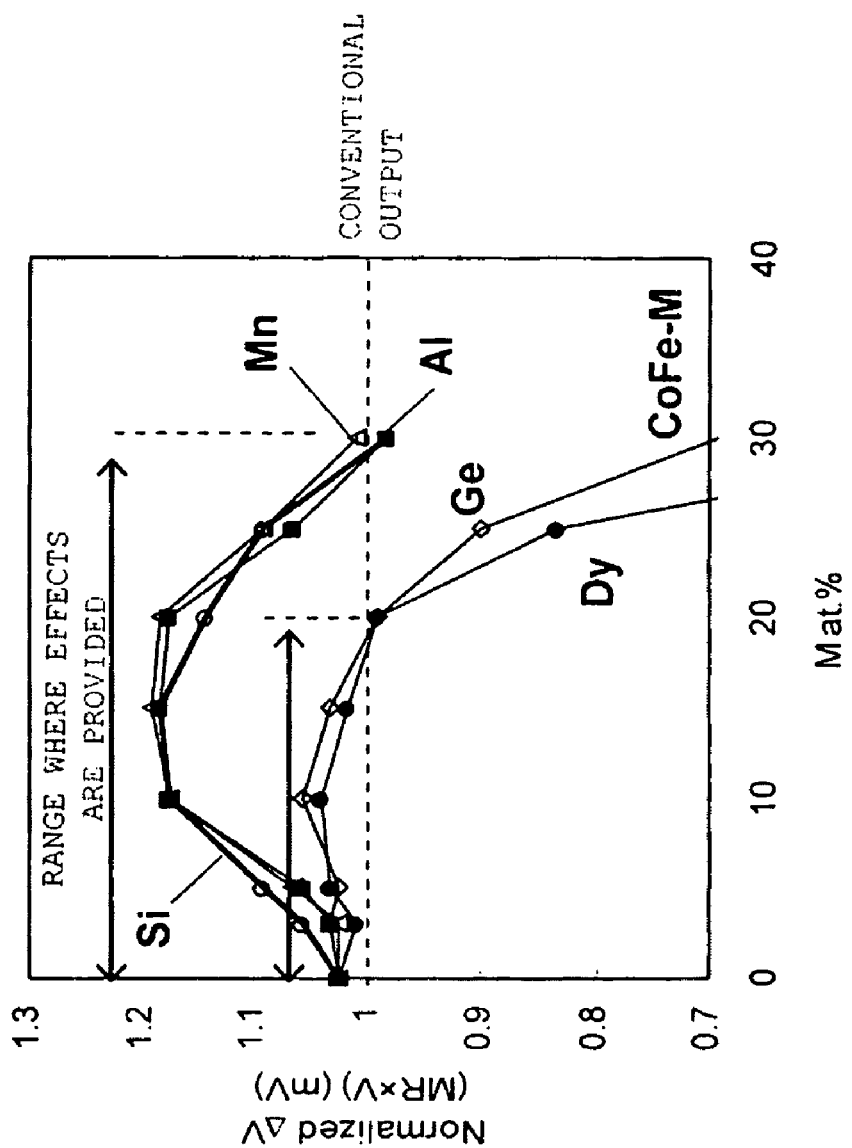
FIG. 5 shows the M-amount dependence of output voltage when using a CoFe-M intermediate pinned layer.

FIG. 5 shows the M concentration dependence of output voltage in a magnetoresistive element in which Co—Mn—Ge is used for, the intermediate free layer and CoFe-M (M=Al, Si, Mn, Dy, Ge) and Co—Fe are used for the intermediate pinned layer, where the conventional output is taken as 1. As the conventional output herein, the output of Experimental Example 3-9 where Co—Mn—Ge was used for both the intermediate pinned layer and the intermediate free layer was employed. An increase in output is obtained when an electron flows from a free layer to a pinned layer in a magnetoresistive element where M=Al, Si, Mn, Ge, Dy. In particular, when Al, Si, or Mn is added in a proportion of 30% or less, the output voltage can be improved over the conventional structure. At this time, the output voltage can be improved by up to about 20% over the conventional structure. Further, when Ge or Dy is added as M, if the amount thereof is 20% or less, the output voltage can be improved over the conventional structure. Further, also when Co—Fe is used for the intermediate pinned layer, an improvement is observed. In addition, although this is not illustrated, when Ga, Sn, or Sb, which is an element of the same family or same metalloid as Al, Si, and Ge, was used; and also when Tb, Ho, or Er belonging to the same lanthanoid as Dy was used as M, high spin scattering efficiency and bias-voltage-dependence resistance was combined, and improvement in output voltage was achieved.

Although Experimental Example 4 only shows the results of using Co—Mn—Ge for an intermediate free layer, the same results were obtained when using, for the intermediate free layer, a Heusler alloy layer having a composition represented by X—Y—Z, wherein X is Co or Fe that satisfies 45 at. % $\leq$ X $\leq$ 55 at. %, Y is one or more elements selected from V, Cr, Mn, and Fe that satisfy 20 at. % $\leq$ Y $\leq$ 30 at. %, and Z is one or more elements selected from Al, Si, Ga, Ge, Sn, and Sb that satisfy 20 at. % $\leq$ Z $\leq$ 35 at. %.

Further, although the above results are results of using an AlCu—Ox current confinement layer for an intermediate layer, because the free layer and the pinned layer are the main factors of the bias voltage dependence of MR ratio, the same effects were provided also from a magnetoresistive element in which a non-magnetic conductive layer made of Cu, Ag, Au, Cr, or the like or an insulating layer made of MgO, Al—Ox, Ti—Ox, or the like was used for the intermediate layer.

Experimental Example 5

Experimental Examples 5-1 to 5-4 in Table 7 present experimental examples for magnetoresistive elements using Co—Mn—Z (Z=Ge, Si) with a Z composition of 30 at. % for the intermediate pinned layer and Co—Mn—Z (Z=Ge, Si) with a smaller Z composition than in the intermediate pinned layer for the intermediate free layer of Table 3, and show the saturation magnetization of the intermediate pinned layer and the intermediate free layer, the MR ratio (MR) at an applied voltage of 10 mV, the voltage when the MR ratio decreases to 80% of the maximum (V80), the maximum output value ((MR×V)max), and the direction of electron flow when the maximum output value is obtained. Other film structures are as shown in Table 3. Values other than saturation magnetization were evaluated from the bias voltage dependence of MR ratio and output, as shown in FIG. 2. V80 introduced here is a criterion for the bias voltage resistance of MR ratio. The greater the value, the higher the bias voltage resistance, indicating that large MR ratio can be maintained to a higher bias voltage. Experimental Examples 5-5 and 3-9 show the cases of using Co—Mn—Z (Z=Ge, Si) with a Z composition of 30 at. % for both the intermediate pinned layer and the intermediate free layer. Here, when the voltage is positive, an electron moves from the free layer to the pinned layer, while when the voltage is negative, an electron moves from the pinned layer to the free layer.

TABLE 7

| | Intermediate pinned layer | Saturation magnetization (T) | Intermediate free layer | Saturation magnetization (T) | MR (%) | V80− (mV) | V80+ (mV) | (MR × V) max (mV) | Electron flow at maximum output |
|---|---|---|---|---|---|---|---|---|---|
| Experimental Example 5-1 | Co48Mn22Ge30 | 1.0 | Co50Mn24Ge26 | 1.2 | 19.5 | 63 | 52 | 13.3 | Pinned → Free |
| Experimental Example 5-2 | Co48Mn22Ge30 | 1.0 | Co54Mn24Ge22 | 1.3 | 18.1 | 71 | 47 | 13.1 | Pinned → Free |
| Experimental Example 5-3 | Co48Mn22Si30 | 1.0 | Co50Mn24Si26 | 1.2 | 18.9 | 62 | 49 | 13.6 | Pinned → Free |
| Experimental Example 5-4 | Co48Mn22Si30 | 1.0 | Co54Mn24Si22 | 1.3 | 17.6 | 74 | 47 | 12.9 | Pinned → Free |
| Experimental Example 5-5 | Co48Mn22Si30 | 1.0 | Co48Mn22Si30 | 0.9 | 19.3 | 51 | 52 | 12.3 | Free → Pinned |
| Experimental Example 3-9 | Co48Mn22Ge30 | 1.0 | Co48Mn22Ge30 | 0.9 | 20.1 | 45 | 49 | 12.0 | Free → Pinned |

In contrast with the magnetoresistive elements of Experimental Examples 5-5 and 3-9 where Co—Mn—Z (Z=Ge, Si) with a Z composition of 30 at. % was used for the intermediate free layer, in Experimental Examples 5-1 to 5-4 having an intermediate free layer with a reduced Z composition, the saturation magnetization of the intermediate free layer is increased, and thus the bias voltage dependence of MR ratio is improved at a negative bias voltage where an electron moves from the pinned layer to the free layer. Meanwhile, because the MR ratio does not undergo a significant decrease for the Z composition, at a negative bias voltage where an electron enters a free layer from a pinned layer, the output voltage can be increased as compared with the conventional structure where Co—Mn—Z (Z=Ge, Si) with a Z composition of 30 at. % is used for both the intermediate free layer and the intermediate pinned layer.

Figure 6:
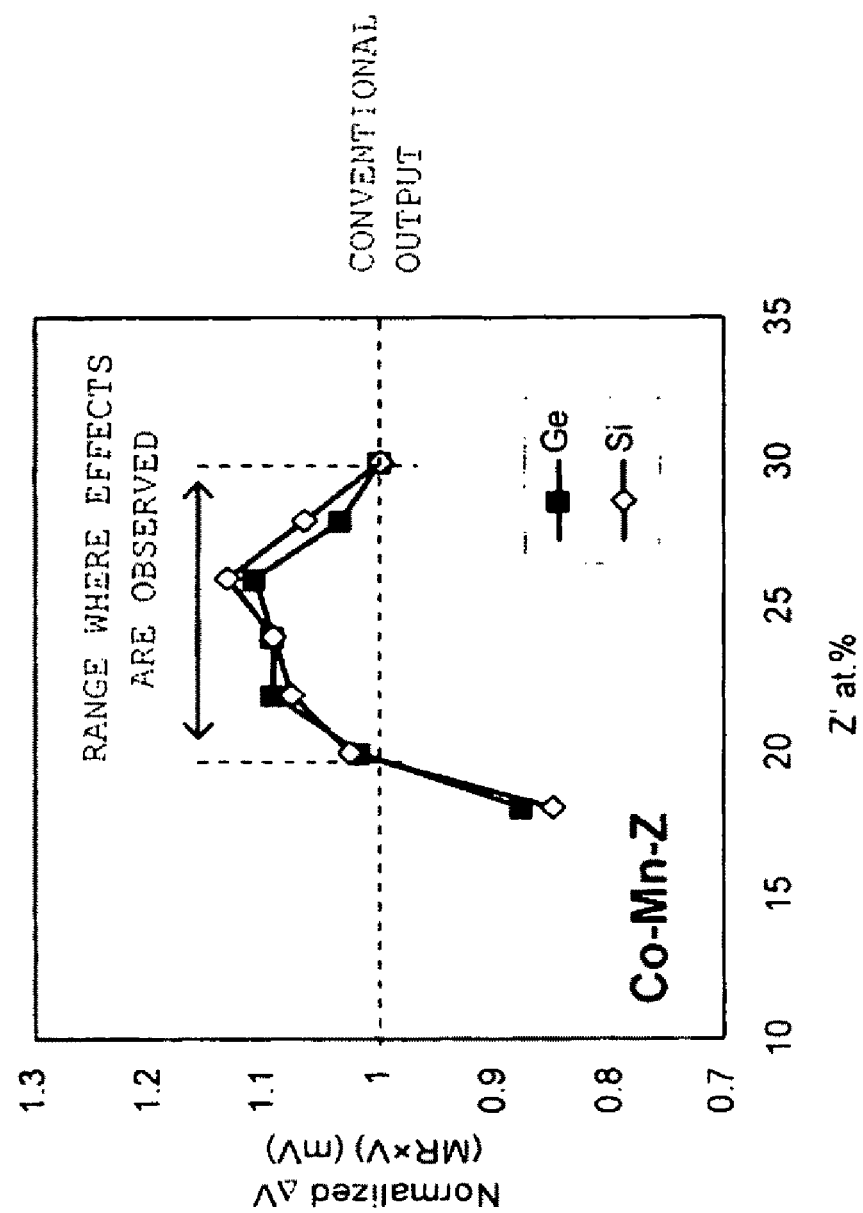
FIG. 6 shows the Z'-amount dependence of output voltage when using a Co—Mn—Z' (Z'=Si, Ge) intermediate free layer.

FIG. 6 shows the Z composition dependence of output voltage of a magnetoresistive element in which Co—Mn—Z (Z=Si, Ge) with a Z composition of 30 at. % is used for the intermediate pinned layer and Co—Mn—Z' (Z'<Z) with a smaller Z composition than in the intermediate pinned layer is used for the intermediate free layer, taking the output obtained in Experimental Example 5-5 and Experimental Example 3-9 as 1, where Co—Mn—Z (Z=Ge, Si) with a Z composition of 30 at. % was used for both the intermediate free layer and the intermediate pinned layer. When the Z' composition of the intermediate free layer Co—Mn—Z' is 20 at. %≦Z'<30 at. %, a higher output voltage was obtained compared with a magnetoresistive element of the conventional structure where Co—Mn—Z with a Z composition of 30 at. % is used for both the intermediate free layer and the intermediate pinned layer.

tion were evaluated from the bias voltage dependence of MR ratio and output, as shown in FIG. 2. V80 introduced here is a criterion for the bias voltage resistance of MR ratio. The greater the value, the higher the bias voltage resistance, indicating that large MR ratio can be maintained to a higher bias voltage. Experimental Examples 5-5 and 3-9 show the cases of using Co—Mn—Z (Z=Ge, Si) with a Z composition of 30 at. % for both the intermediate pinned layer and the intermediate free layer. Here, when the voltage is positive, an electron moves in the direction from the free layer to the pinned layer, while when the voltage is negative, an electron moves in the direction from the pinned layer to the free layer.

TABLE 8

| | Intermediate pinned layer | Saturation magnetization (T) | Intermediate free layer | Saturation magnetization (T) | MR (%) | V80− (mV) | V80+ (mV) | (MR × V) max (mV) | Electron flow at maximum output |
|---|---|---|---|---|---|---|---|---|---|
| Experimental Example 6-1 | Co50Mn24Ge26 | 1.2 | Co48Mn22Ge30 | 1.0 | 18.9 | 50 | 65 | 13.2 | Free → Pinned |
| Experimental Example 6-2 | Co54Mn26Ge22 | 1.3 | Co48Mn22Ge30 | 1.0 | 17.7 | 48 | 73 | 12.9 | Free → Pinned |
| Experimental Example 6-3 | Co50Mn24Si26 | 1.2 | Co48Mn22Si30 | 1.0 | 18.3 | 55 | 65 | 12.9 | Free → Pinned |
| Experimental Example 6-4 | Co54Mn26Si22 | 1.3 | Co48Mn22Si30 | 1.0 | 17.3 | 48 | 78 | 12.8 | Free → Pinned |
| Experimental Example 5-5 | Co48Mn22Si30 | 1.0 | Co48Mn22Si30 | 0.9 | 19.3 | 51 | 52 | 12.3 | Free → Pinned |
| Experimental Example 3-9 | Co48Mn22Ge30 | 1.0 | Co48Mn22Ge30 | 0.9 | 20.1 | 45 | 49 | 12.0 | Free → Pinned |

Such an effect is realized not only by Co—Mn—Z but also by any Heusler alloy, and when a driving voltage is applied so that an electron flows from a magnetic layer with lower saturation magnetization into a magnetic layer with higher saturation magnetization, the same effect is obtained. As used herein, a Heusler alloy is a material having a composition represented by X—Y—Z, wherein X is Co or Fe that satisfies 45 at. % 5≦X≦55 at. %, Y is one or more elements selected from V, Cr, Mn, and Fe that satisfy 20 at. %≦Y≦30 at. %, and Z is one or more elements selected from Al, Si, Ga, Ge, Sn, and Sb that satisfy 20 at. %≦Z≦35 at. %.

Further, although the above results are results of using an AlCu—Ox current confinement layer for an intermediate layer, because the free layer and the pinned layer are the main factors of the bias voltage dependence of MR ratio, the same effects are provided also from a magnetoresistive element in which a non-magnetic conductive layer made of Cu, Ag, Au, Cr, or the like or an insulating layer made of MgO, Al—Ox, Ti—Ox, or the like is used for the intermediate layer.

Experimental Example 6

Experimental Examples 6-1 to 6-4 in Table 8 represent experimental examples for magnetoresistive elements using Co—Mn—Z (Z=Ge, Si) with a Z composition of 30 at. % for the intermediate free layer and Co—Mn—Z' (Z'=Ge, Si) with a smaller Z composition than in the intermediate free layer for the intermediate pinned layer of Table 3, and show the saturation magnetization of the intermediate pinned layer and the intermediate free layer, the MR ratio (MR) at an applied voltage of 10 my, the voltage when the MR ratio decreases to 80% of the maximum (V80), the maximum output value ((MR×V)max), and the direction of electron flow when the maximum output value is obtained. Other film structures are as shown in Table 3. Values other than saturation magnetiza- In contrast with the magnetoresistive elements of Experimental Examples 5-5 and 3-9 where Co—Mn—Z (Z=Ge, Si) with a Z composition of 30 at. % was used for the intermediate pinned layer, in Experimental Examples 6-1 to 6-4 having an intermediate pinned layer with a reduced Z composition, the saturation magnetization of the intermediate pinned layer is increased, and thus the bias voltage dependence of MR ratio is improved at a positive bias voltage where an electron moves from the free layer to the pinned layer. Meanwhile, because the MR ratio does not undergo a significant decrease for the Z composition, at a positive bias voltage where an electron enters the pinned layer from the free layer, the output voltage can be increased as compared with the conventional structure where Co—Mn—Z (Z=Ge, Si) with a Z composition of 30 at. % is used for both the intermediate free layer and the intermediate pinned layer.

Figure 7:
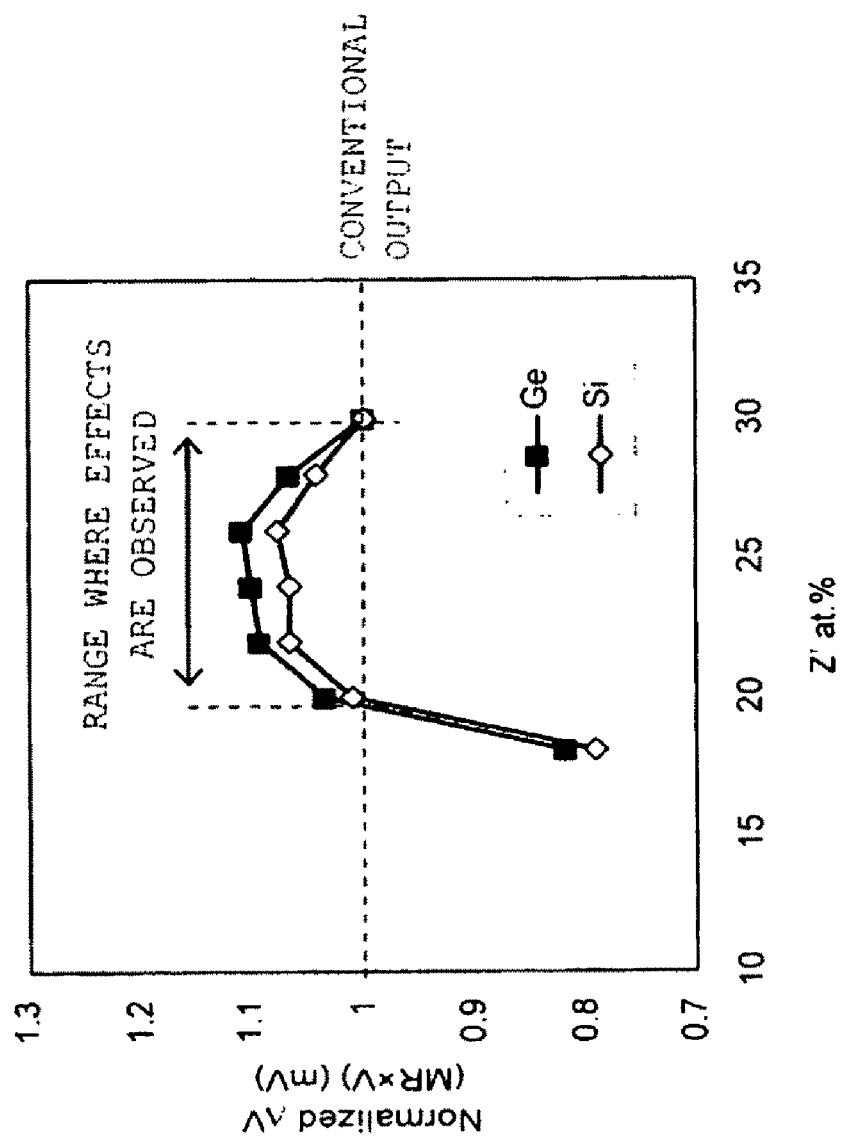
FIG. 7 shows the Z'-amount dependence of output voltage when using a Co—Mn—Z' (Z'=Si, Ge) intermediate pinned layer.

FIG. 7 shows the Z composition dependence of output voltage of a magnetoresistive element in which Co—Mn—Z (Z=Si, Ge) with a Z composition of 30 at. % is used for the intermediate free layer and Co—Mn—Z' (Z'=Si, Ge) with a smaller Z composition than in the intermediate free layer is used for the intermediate pinned layer, taking the output obtained in Experimental Example 5-5 and Experimental Example 3-9 as 1, where Co—Mn—Z (Z=Ge, Si) with a Z composition of 30 at. % was used for both the intermediate free layer and the intermediate pinned layer. When the Z' composition of the intermediate pinned layer Co—Mn—Z' was 20 at. %≦Z'<30 at. %, a higher output voltage was obtained compared with a magnetoresistive element of the conventional structure where Co—Mn—Z with a Z composition of 30 at. % is used for both the intermediate free layer and the intermediate pinned layer.

Such an effect is realized not only by Co—Mn—Z but also by any Heusler alloy, and the same effect is provided. As used herein, a Heusler alloy is a material having a composition represented by X—Y—Z, wherein X is Co or Fe that satisfies 45 at. % 5≦X≦55 at. %, Y is one or more elements selected from V, Cr, Mn, and Fe that satisfy 20 at. %≦Y≦30 at. %, and Z is one or more elements selected from Al, Si, Ga, Ge, Sn, and Sb that satisfy 20 at %≦Z≦35 at. %.

Further, although the above results are results of using an AlCu—Ox current confinement layer for an intermediate layer, because the free layer and the pinned layer are the main factors of the bias voltage dependence of MR ratio, the same effects are provided also from a magnetoresistive element in which a non-magnetic conductive layer made of Cu, Ag, Au, Cr, or the like or an insulating layer made of MgO, Al—Ox, Ti—Ox, or the like is used for the intermediate layer.

Experimental Example 7

The saturation magnetization mentioned above can also be considered as average saturation magnetization. That is, when the thickness of magnetic layers other than the high-spin scattering material that contributes to the increase in MR ratio is increased, the bias voltage dependence can be improved, and further, the output voltage can be increased.

Table 9 shows the laminate structure and the thickness of a magnetoresistive element according to another embodiment of the present invention. This only shows the results of using Co—Mn—Ge for the intermediate pinned layer and the intermediate free layer, and varying the thickness of $Co_{50}Fe_{50}$ (hereinafter referred to as a laminate CoFe) placed so as to contact each Co—Mn—Ge at both sides.

TABLE 9

| Structure of Magnetoresistive Film | | Material | Thickness (nm) |
|---|---|---|---|
| | Cap layer | Ru | 7.0 |
| | | Cu | 2.0 |
| | Free layer | Co50Fe50 | t4 |
| | | Co48Mn22Ge30 | 3.0 |
| | | Co50Fe50 | t3 |
| Intermediate layer | Current confinement layer | AlCu—O | 0.7 |
| | Current path forming layer | Cu | 0.5 |
| Pinned layer | Second ferromagnetic pinned layer | Co50Fe50 | t2 |
| | | Co48Mn22Ge30 | 3.0 |
| | | Co50Fe50 | t1 |
| | Antiparallel coupling intermediate layer | Ru | 0.8 |
| | First ferromagnetic pinned layer | CoFe | 3.0 |
| | Antiferromagnetic layer | MnIr | 6.0 |
| | Underlayer | Ru | 2.0 |
| | | Ta | 3.0 |

Experimental Examples 7-1 to 7-8 in Table 10 present experimental examples of magnetoresistive elements using Co—Mn—Z (Z=Ge, Si) with a Z composition of 30 at. % for the intermediate pinned layer and the intermediate free layer, with varying the thickness of a laminate CoFe, and show the thickness of the laminate CoFe, the average saturation magnetization of the second ferromagnetic pinned layer and the free layer, the MR ratio (MR) at an applied voltage of 10 mV, the voltage when the MR ratio decreases to 80% of the maximum (V80), the maximum output value ((MR×V)max), and the direction of electron flow when the maximum output value is obtained. Values other than saturation magnetization were evaluated from the bias voltage dependence of MR ratio and output, as shown in FIG. 2. V80 introduced here is a criterion for the bias voltage resistance of MR ratio. The greater the value, the higher the bias voltage resistance, indicating that large MR ratio can be maintained to a higher bias voltage. Further, Experimental Example 3-9 shows the case where the four layers of the laminate CoFe are all formed to a thickness of 0.5 nm. Here, when the voltage is positive, an electron moves in the direction from the free layer to the pinned layer, while when the voltage is negative, an electron moves in the direction from the pinned layer to the free layer.

TABLE 10

| Average saturation magnetization of free layer (T) | MR (%) | V80− (mV) | V80+ (mV) | (MR × V) max (mV) | Electron flow at maximum output |
|---|---|---|---|---|---|
| 1.3 | 20.0 | 50 | 60 | 13.5 | Free → Pinned |
| 1.3 | 18.5 | 48 | 69 | 13.1 | Free → Pinned |
| 1.4 | 19.8 | 59 | 52 | 13.4 | Pinned → Free |
| 1.5 | 18.1 | 66 | 49 | 12.6 | Pinned → Free |
| 1.3 | 20.0 | 50 | 55 | 12.7 | Free → Pinned |
| 1.3 | 20.1 | 48 | 61 | 12.4 | Free → Pinned |
| 1.4 | 20.0 | 57 | 49 | 12.8 | Pinned → Free |
| 1.5 | 19.9 | 60 | 51 | 12.7 | Pinned → Free |
| 1.2 | 20.1 | 45 | 49 | 12.0 | Free → Pinned |

As shown in Experimental Examples 7-1 and 7-2, when the thickness of a pinned layer laminate CoFe layer (t2) is increased, at a positive bias voltage where an electron is transmitted from a free layer to a pinned layer, the bias resistance of MR ratio at a positive bias voltage is improved than in Experimental Example 3-9. When the thickness of CoFe with a small bulk scattering coefficient, which is in contact with the intermediate layer, is increased, although the MR ratio tends to decrease than in Experimental Example 3-9, the output voltage can be increased according to the increase in bias resistance. Similarly, as shown in Experimental Examples 7-3 and 7-4, when the thickness of the laminate CoFe layer (t3) of the free layer, which is in contact with the intermediate layer, is increased, at a negative bias voltage where an electron is transmitted from a pinned layer to a free layer, the bias resistance of MR ratio at a negative bias voltage is improved than in Experimental Example 3-9. As a result, the output voltage can be increased.

In Experimental Examples 7-5 and 7-6, the results of increasing the thickness of CoFe (t1) that contacts the pinned layer Co—Mn—Ge in an opposite direction to the intermediate layer are shown. Further, in Experimental Examples 7-7 and 7-8, the results of increasing the thickness of CoFe (t4) that contacts the free layer Co—Mn—Ge in an opposite direction to the intermediate layer are shown. When the t1 and t4 are increased, the bias resistance of MR ratio at a positive bias voltage and that at negative bias voltage can be improved, respectively. Further, because the MR ratio is equal to that in Experimental Example 3-9, as a result, at a bias voltage where an electron enters the side of higher average saturation magnetization, the output can be improved.

Thus, also when the thickness of a laminate CoFe is increased and the average saturation magnetization of the side into which an electron flows is improved, the bias resistance of MR ratio can be improved, and as a result, the output voltage can be increased.

Figure 8:
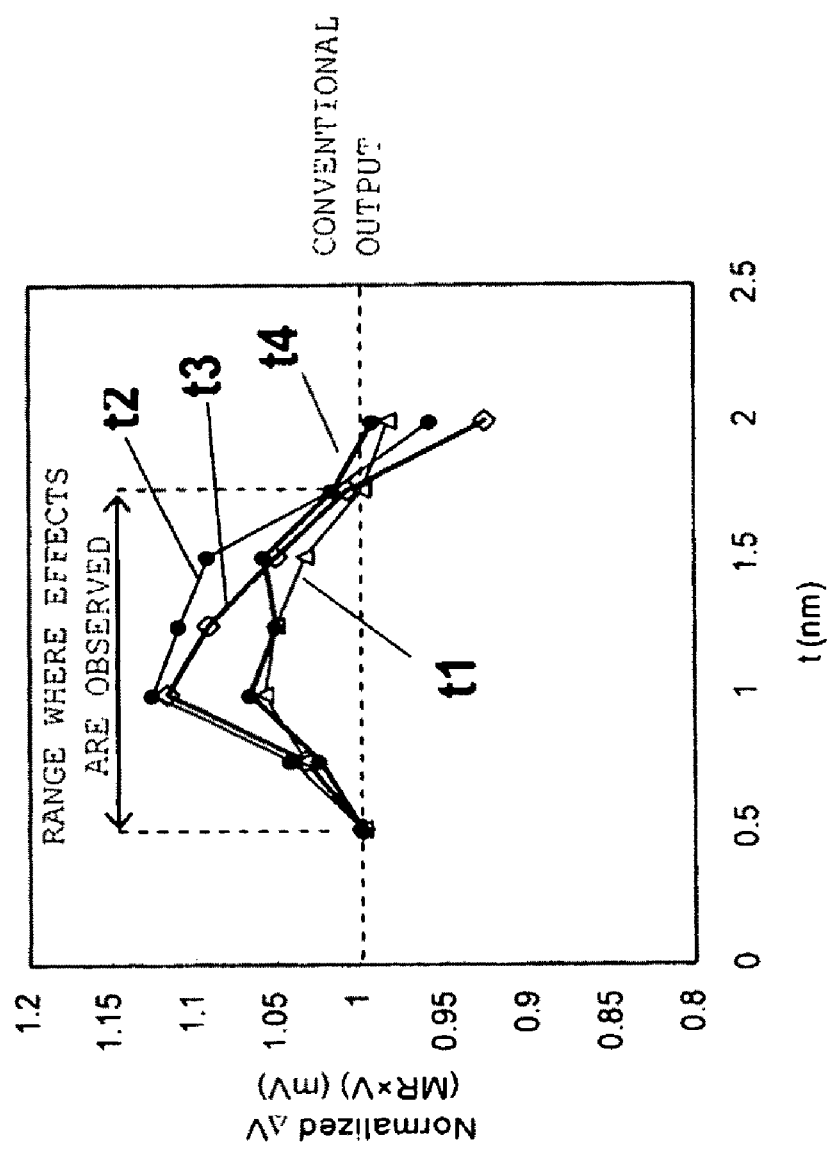
FIG. 8 shows the output voltage when varying the laminate CoFe thickness.

FIG. 8 shows the output voltage of the magnetoresistive element with varying each laminate CoFe thickness. Here, the CoFe thickness other than the variable parameter was set at 0.5 mm. When t1 and t2 were increased, an increase in output voltage was observed at a positive bias voltage where an electron moves from a free layer to a pinned layer. When t3 and t4 were increased, an increase in output voltage was observed at a negative bias voltage where an electron moves from a pinned layer to a free layer. With an increase in the thickness of a laminate CoFe, the bias voltage resistance of MR ratio is improved. On the contrary, because the thickness of CoFe with a little spin scattering effect is increased, the MR ratio decreases, and a peak appears in the output voltage. At this time, the thickness (t) of the laminate CoFe where an increase in output is observed was in the range of $0.5 < t \leq 2.0$ nm. Further, the output increase was particularly remarkable when t2 and t3 were increased.

Such an effect is not limited to a single composition $Co_{50}Fe_{50}$, but can be provided when the average saturation magnetization of the current inflow side is larger than that of the other side. The composition of $Co_{1-x}Fe_x$ thus is not limited. Further, also when one or more elements selected from Ni, Al, Mn, Ge, Dy, Ga, Sn, Sb, Dy, Tb, Ho, and Er are added to the laminate Co—Fe, if a difference in thickness is provided, the same effect is provided.

Although Experimental Example 7 only shows the results of using Co—Mn—Ge for an intermediate free layer and an intermediate pinned layer, the same results were obtained when using, for the intermediate pinned layer and the intermediate free layer, a composition represented by X—Y—Z, wherein X is Co or Fe that satisfies 45 at. % $0.5 \leq X \leq 55$ at. %, Y is one or more elements selected from V, Cr, Mn, and Fe that satisfy 20 at. % $\leq Y \leq 30$ at. %, and Z is one or more elements selected from Al, Si, Ga, Ge, Sn, and Sb that satisfy 20 at. % $\leq Z \leq 35$ at. %.

Further, although the above results are results of using an AlCu—Ox current confinement layer for an intermediate layer, because the free layer and the pinned layer are the main factors of the bias voltage dependence of MR ratio, the same effects are provided also from a magnetoresistive element in which a non-magnetic conductive layer made of Cu, Ag, Au, Cr, or the like or an insulating layer made of MgO, Al—Ox, Ti—Ox, or the like is used for the intermediate layer.

Experimental Example 8

Figure 9:
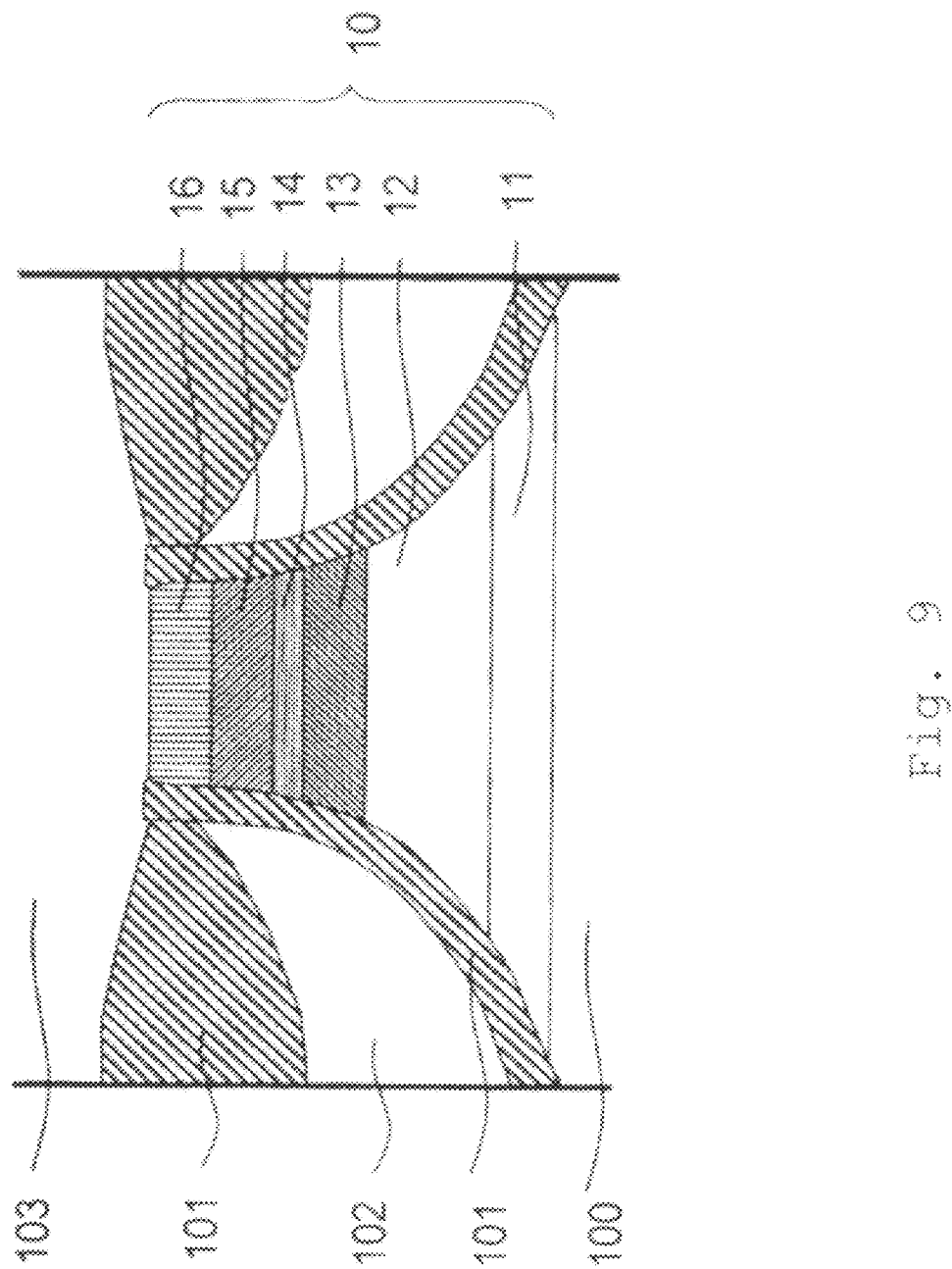
FIG. 9 is a schematic diagram of the cross-sectional structure of a magnetoresistive head.

FIG. 9 shows a cross-sectional structure of a magnetoresistive magnetic head comprising a magnetoresistive film 10. The shape and the thickness are not necessarily as illustrated therein. The magnetoresistive magnetic head in this approach is placed so as to be sandwiched between a lower shield electrode 100 and an upper shield electrode 103, and comprises a laminate of an underlayer 11, an antiferromagnetic layer 12, a pinned layer 13, an intermediate layer 14, a free layer 15, and a protective layer 16. A hard bias layer 102 that is electrically separated from the magnetoresistive element 10 by an insulating layer 101 is used for applying a bias magnetic field in the track width direction to a free layer, so that the magnetization of the free layer becomes uniform. For the hard bias layer 102, a Co—Cr—Pt alloy or the like is used, for example. For the insulating layer 101, $Al_2O_3$, $SiO_2$, or the like can be used, for example.

Figure 10:
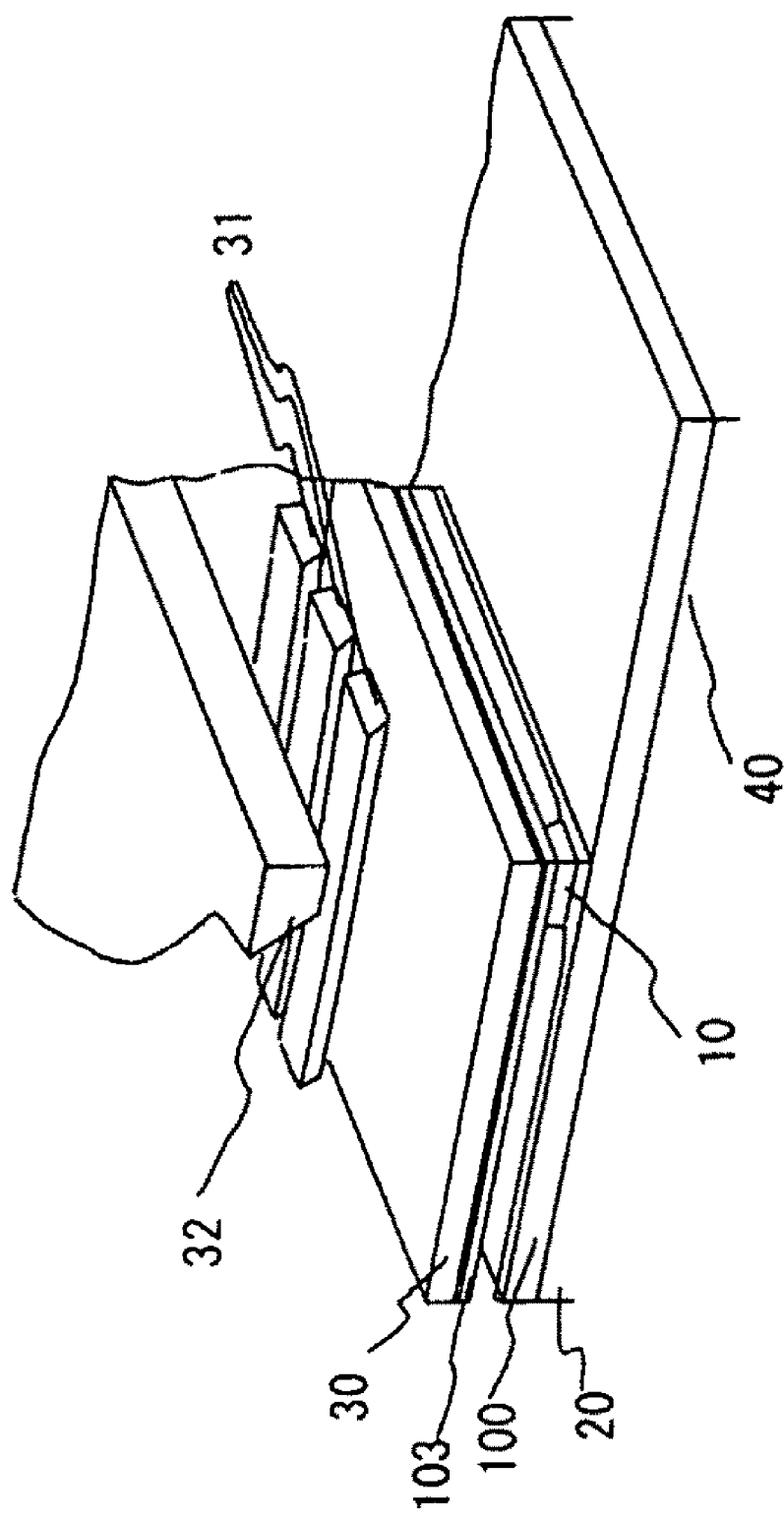
FIG. 10 is a schematic diagram of a recording/reading separated magnetic head for perpendicular recording.

FIG. 10 schematically shows a recording/reading separated magnetic head for perpendicular recording, having mounted thereon a magnetoresistive magnetic head provided with the magnetoresistive element according to one embodiment of the present invention. It comprises, on a substrate 20 that also serves as a slider, a magnetoresistive laminated film 10, a lower magnetic shield and electrode 100, an upper magnetic shield and electrode 103, an auxiliary magnetic pole 30, a coil 31, and a main magnetic pole 32, and forms a facing surface 40 that faces a recording medium. With respect to structures corresponding to the insulating layer 101 and the hard bias layer 102 given in FIG. 9, descriptions are omitted in FIG. 10. The magnetic head according to embodiments of the present invention increases the capability of the reading section, and thus is a technology applicable to both perpendicular recording and conventional in-plane recording. However, combination with a perpendicular magnetic recording head particularly provides higher recording density.

Figure 11:
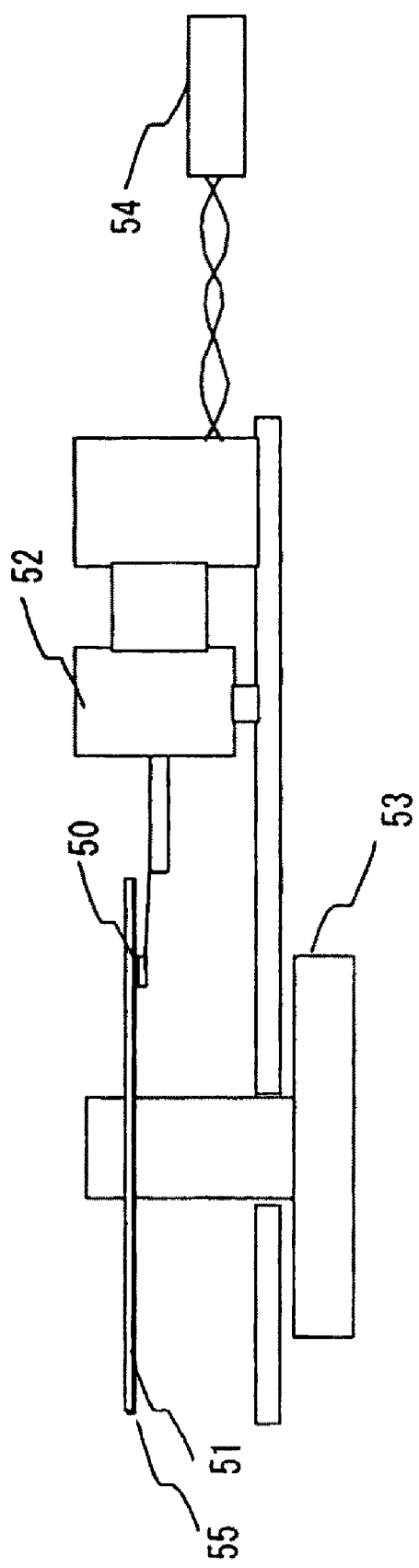
FIG. 11 shows a structural example of a magnetic recording/reading apparatus.

FIG. 11 is a schematic diagram showing a structural example of a magnetic recording/reading apparatus using the magnetic head according to one embodiment of the present invention. A disk 55 holding a recording medium 51 that magnetically records information is rotated by a spindle motor 53, and the head slider 50 is guided onto the track of the disk 55 by an actuator 52. More specifically, in the magnetic disk apparatus, owing to this mechanism, the reading head and the recording head formed on the head slider 50 approach the predetermined recording position on the disk 55 and make relative motions, thereby successively writing and reading signals. The actuator 52 is preferably a rotary actuator. The recording head records the signals on the medium through a signal-processing system 54. The output from the reading head through the signal-processing system 54 is obtained as a signal. Further, when moving the reading head onto a desired recording track, a high sensitivity output from the reading head can be used to detect a position on the track, control the actuator 52, and position the head slider 50. Although FIG. 11 shows a single head slider 50 and a single disk 55, there may be more than one such component. The disk 55 may have on both sides thereof recording mediums 51 to record information. When information is recorded on both sides of the disk, the head slider 50 is placed on each side of the disk.

With respect to the above structure, examination was conducted on the magnetoresistive magnetic head of an embodiment of the invention and a magnetic recording/reading apparatus equipped with the same. As a result, it was confirmed that an increased output is obtained therefrom. In addition, the yield at the time of production was also excellent.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A magnetoresistive magnetic head using a current-perpendicular-to-plane magnetoresistive element comprising a laminate of a free layer, an intermediate layer, and a pinned layer, the pinned layer being substantially fixed to a magnetic field to be detected, either the pinned layer or the free layer including a Heusler alloy layer represented by the composition of X—Y—Z, wherein X is between about 45 at. % and about 55 at. % and is Co or Fe, Y accounts for between about 20 at. % and about 30 at. % and is one or more elements selected from V, Cr, Mn, and Fe, and Z is between about 20 at. % and about 35 at. % and is one or more elements selected from Al, Si, Ga, Ge, Sn, and Sb, the other layer including a layer of Co—Fe—M or Co—Fe, wherein M is one or more elements selected from Ge, Ga, Sn, Sb, Dy, Tb, Ho, and Er and the amount of M added is not less than 0 at. % and not more than 20 at. %.

2. The magnetoresistive magnetic head according to claim 1, wherein the direction of the current flowing perpendicular to plane is a direction from the Heusler alloy layer to the layer of Co—Fe-M or Co—Fe.

3. The magnetoresistive magnetic head according to claim 1, wherein the pinned layer includes the Heusler alloy positioned between thin CoFe layers and/or Co layers.

4. The magnetoresistive magnetic head according to claim 1, wherein the Heusler alloy has a crystal structure of L21, D03, or 132.

5. A system, comprising:
a magnetic storage medium;
at least one head as recited in claim 1 for reading from the magnetic medium;
a slider for supporting the head; and
a control unit coupled to the head for controlling operation of the head.

6. A magnetoresistive magnetic head using a current-perpendicular-to-plane magnetoresistive element comprising a laminate of a free layer, an intermediate layer, and a pinned layer, the pinned layer being substantially fixed to a magnetic field to be detected,
either the pinned layer or the free layer including a Hensler alloy layer represented by the composition of X—Y—Z, wherein X is between about 45 at. % and about 55 at. % and is Co or Fe, Y accounts for between about 20 at. % and about 30 at. % and is one or more elements selected from V, Cr, Mn, and Fe, and Z is between about 20 at. % and about 35 at. % and is one or more elements selected from Al, Si, Ga, Ge, Sn, and Sb, the other layer including a layer of Co—Fe—M or Co—Fe,
wherein M is one or more elements selected from Ge, Ga, Sn, Sb, Dy, Tb, Ho, and Er, and the amount of M added is not less than 0 at. % and not more than 20 at. %, and
wherein the direction of the current flowing perpendicular to plane is a direction from the Heusler alloy layer to the layer of Co—Fe-M or Co—Fe.

7. The magnetoresistive magnetic head according to claim 6, wherein the Heusler alloy has a crystal structure of L21, D03, or B2.

8. A system, comprising:
a magnetic storage medium;
at least one head as recited in claim 6 for reading from the magnetic medium;
a slider for supporting the head; and
a control unit coupled to the head for controlling operation of the head.

9. The magnetoresistive magnetic head according to claim 6, wherein the pinned layer includes the Heusler alloy positioned between thin CoFe layers and/or Co layers.

10. The magnetoresistive magnetic head according to claim 6, the free layer includes the Hensler alloy positioned between thin CoFe layers and/or Co layers.

11. A magnetoresistive magnetic head using a current-perpendicular-to-plane magnetoresistive element comprising a laminate of a free layer, an intermediate layer, and a pinned layer, the pinned layer being substantially fixed to a magnetic field to be detected,
either the pinned layer or the free layer including a Heusler alloy layer represented by the composition of X—Y—Z, wherein X is between about 45 at. % and about 55 at. % and is Co or Fe, Y is between about 20 at. % and about 30 at. % and is one or more elements selected from V, Cr, Mn, and Fe, and Z is between about 20 at. % and about 35 at. % and is one or more elements selected from Al, Si, Ga, Ge, Sn, and Sb, the other layer including a Heusler alloy layer with a smaller Z composition than that of the Heusler alloy.

12. The magnetoresistive magnetic head according, to claim 11, wherein the direction of the current perpendicular to plane is a direction in which an electron flows from the Heusler alloy layer with a larger Z composition into the Heusler alloy layer with a smaller Z composition.

13. The magnetoresistive magnetic head according to claim 11, wherein the Heusler alloy has a crystal structure of L21, D03, or 132.

14. A system, comprising:
a magnetic storage medium;
at least one head as recited in claim 11 for reading from the magnetic medium;
a slider for supporting the head; and
a control unit coupled to the head for controlling operation of the head.

15. A magnetoresistive magnetic head using a current-perpendicular-to-plane magnetoresistive element comprising a laminate of a free layer, an intermediate layer, and a pinned layer, the pinned layer being substantially fixed to a magnetic field to be detected,
both the pinned layer and the free layer each including a film comprising a laminate of a Heusler alloy layer represented by the composition of X—Y—Z and a Co—Fe layer, wherein X is between about 45 at. % and about 55 at. % and is Co or Fe, Y is between about 20 at. % and about 30 at. % and is one or more elements selected from V, Cr, Mn, and Fe, and Z is between about 20 at. % and about 35 at. % and is one or more elements selected from Al, Si, Ga, Ge, Sn, and Sb, the Co—Fe layers included in the pinned layer and the free layer having different total thicknesses,
the direction of the current perpendicular to plane being a direction in which an electron flows from the side where the Heusler alloy layer and the Co—Fe layer with lower average saturation magnetization are laminated into the side where the Heusler alloy layer and the Co—Fe layer with higher average saturation magnetization are laminated.

16. The magnetoresistive magnetic head according to claim 15, wherein the Heusler alloy has a crystal structure of L21, D03, or B2.

17. A system, comprising:
a magnetic storage medium;
at least one head as recited in claim 15 for reading from the magnetic medium;
a slider for supporting the head; and
a control unit coupled to the head for controlling operation of the head.

* * * * *

UNITED STATES PATENT AND TRADEMARK OFFICE
CERTIFICATE OF CORRECTION

PATENT NO. : 8,189,304 B2
APPLICATION NO. : 12/636649
DATED : May 29, 2012
INVENTOR(S) : Okamura et al.

Page 1 of 1

It is certified that error appears in the above-identified patent and that said Letters Patent is hereby corrected as shown below:

In the specification:

col. 2, line 22, replace "in" with --In--;

col. 7, line 24, replace "132" with --B2--;

col. 16, line 17, replace "Cole" with --CoFe--;

col. 19, line 63, replace "10 my" with --10 mV--.

Signed and Sealed this
Twenty-eighth Day of August, 2012

David J. Kappos
*Director of the United States Patent and Trademark Office*